United States Patent
Ezaki et al.

(10) Patent No.: US 7,522,450 B2
(45) Date of Patent: Apr. 21, 2009

(54) MAGNETIC STORAGE CELL, MAGNETIC MEMORY DEVICE AND MAGNETIC MEMORY DEVICE MANUFACTURING METHOD

(75) Inventors: Joichiro Ezaki, Chuo-ku (JP); Keiji Koga, Chuo-ku (JP); Yuji Kakinuma, Chuo-ku (JP); Susumu Haratani, Chuo-ku (JP)

(73) Assignee: TDK Corporation, Tokyo (JP)

( * ) Notice: Subject to any disclaimer, the term of this patent is extended or adjusted under 35 U.S.C. 154(b) by 217 days.

(21) Appl. No.: 10/542,623

(22) PCT Filed: Jan. 21, 2004

(86) PCT No.: PCT/JP2004/000493

§ 371 (c)(1),
(2), (4) Date: Jul. 19, 2005

(87) PCT Pub. No.: WO2004/066387

PCT Pub. Date: Aug. 5, 2004

(65) Prior Publication Data

US 2006/0067111 A1     Mar. 30, 2006

(30) Foreign Application Priority Data

Jan. 24, 2003 (JP) .............. 2003-016692

(51) Int. Cl.
*G11C 11/00* (2006.01)
(52) U.S. Cl. ....................... 365/171; 365/158
(58) Field of Classification Search ............. 365/171, 365/158
See application file for complete search history.

(56) References Cited

U.S. PATENT DOCUMENTS 5,587,943 A * 12/1996 Torok et al. ............ 365/158

(Continued)

FOREIGN PATENT DOCUMENTS

EP        1 406 266 A2     4/2004

(Continued)

OTHER PUBLICATIONS

Scheuerlein et al., "A 10ns Read and Write Non-Volatile Memory Array Using a Magnetic Tunnel Junction and FET Switch in each Cell," ISSCC 2000, Session 7/TD: Emerging Memory & Device Technologies/Paper TA 7.2, pp. 128-129, 2000.

*Primary Examiner*—Michael T Tran
(74) *Attorney, Agent, or Firm*—Oliff & Berridge, PLC

(57) ABSTRACT

A magnetic storage cell being capable of stable writing and having little adverse influence on an adjacent magnetic storage cell, and a magnetic memory device using the magnetic storage cell, and its manufacturing method are provided. In the invention, a plurality of TMR devices (1a) (1b) each including a TMR film (S20) including a connecting portion (14) of which the magnetization direction is changed by an external magnetic field and a second magnetic layer (8) and allowing a current to flow therethrough in a direction perpendicular to a laminate surface, and a toroidal magnetic layer (4) disposed on a surface of the TMR film (S20) so that a direction along the laminate surface is an axial direction and a write bit line (5) and a write word line (6) penetrate through the toroidal magnetic layer (4) are included, and the TMR devices (1a), (1b) share a part of the toroidal magnetic layer (4) between them. Thereby, a decline in the magnitude of a circulating magnetic field in a closed magnetic path can be prevented, and the magnetizations of the connecting portion (14) and the second magnetic layer (8) can be reversed by a smaller write current.

40 Claims, 28 Drawing Sheets

U.S. PATENT DOCUMENTS

| | | | |
|---|---|---|---|
| 5,629,922 A | 5/1997 | Moodera et al. | |
| 5,976,715 A * | 11/1999 | Chen et al. | 428/836.1 |
| 6,885,576 B2 * | 4/2005 | Deak | 365/158 |
| 6,906,947 B2 * | 6/2005 | Bloomquist et al. | 365/158 |
| 6,930,911 B2 | 8/2005 | Ezaki et al. | |
| 6,996,001 B2 | 2/2006 | Ezaki et al. | |
| 7,257,021 B2 * | 8/2007 | Lienau et al. | 365/171 |
| 2002/0186582 A1 * | 12/2002 | Sharma et al. | 365/158 |
| 2003/0161179 A1 * | 8/2003 | Bloomquist et al. | 365/171 |
| 2006/0098478 A1 * | 5/2006 | Ezaki et al. | 365/158 |
| 2006/0256461 A1 | 11/2006 | Ezaki et al. | |

FOREIGN PATENT DOCUMENTS

| | | |
|---|---|---|
| EP | 1 422 721 A2 | 5/2004 |
| JP | A 9-91949 | 4/1997 |
| JP | A 2002-353415 | 12/2002 |
| JP | A 2004-111887 | 4/2004 |
| WO | WO 2004/066308 | 8/2004 |

* cited by examiner

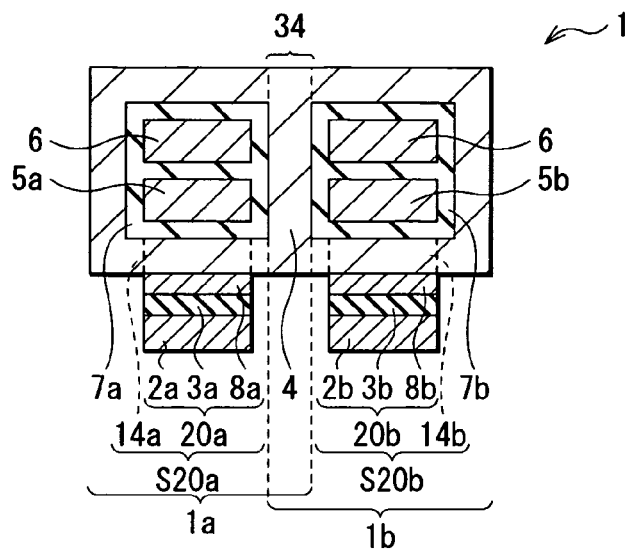
FIG. 5A
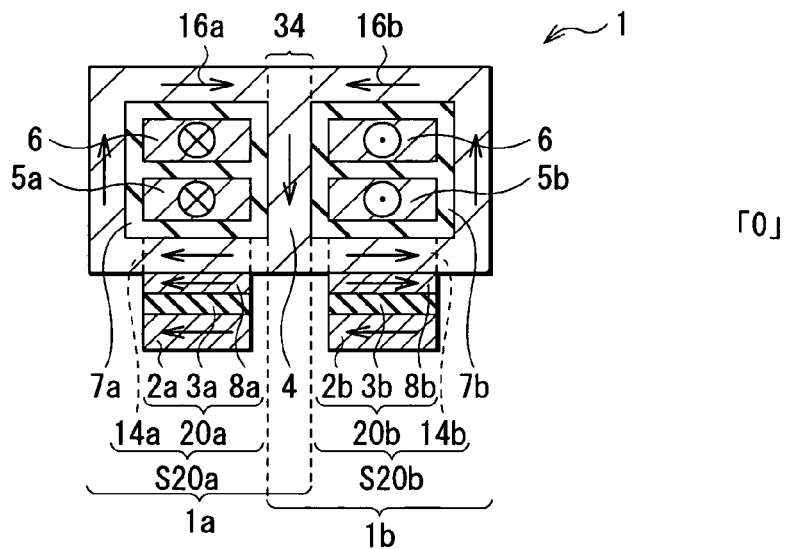
FIG. 5B 「0」
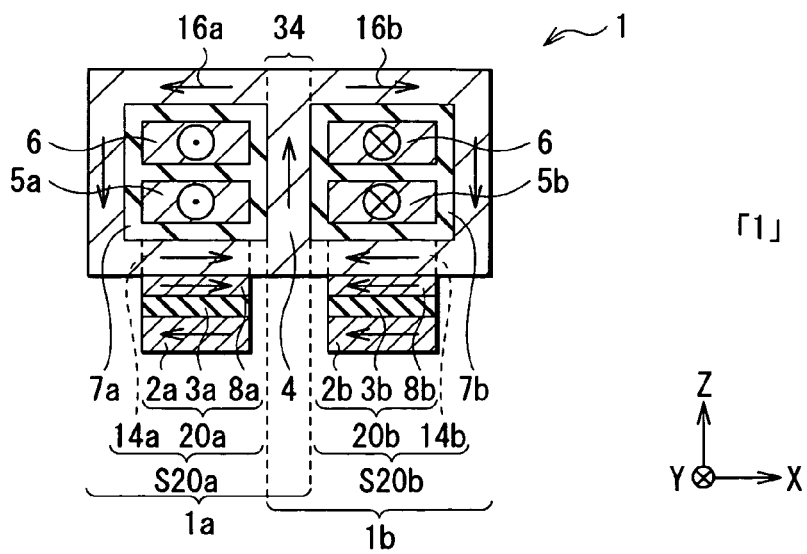
FIG. 5C 「1」

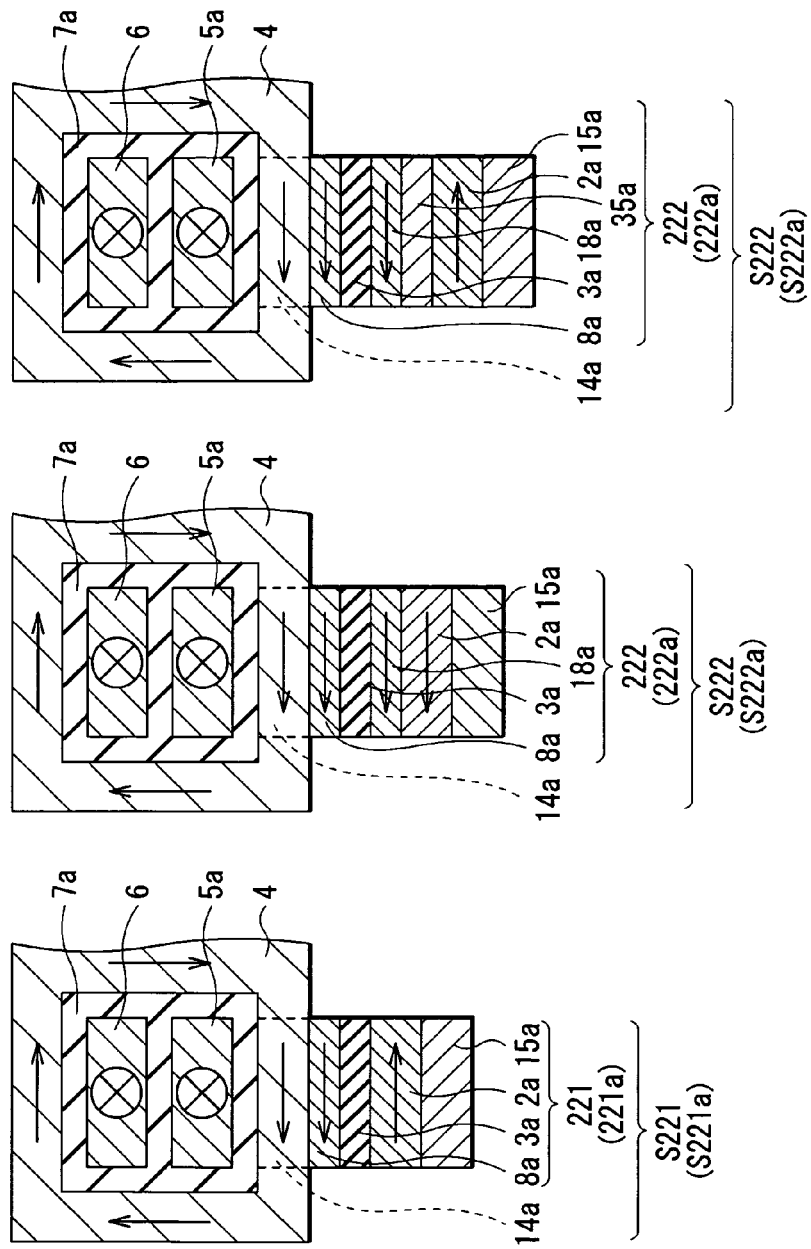

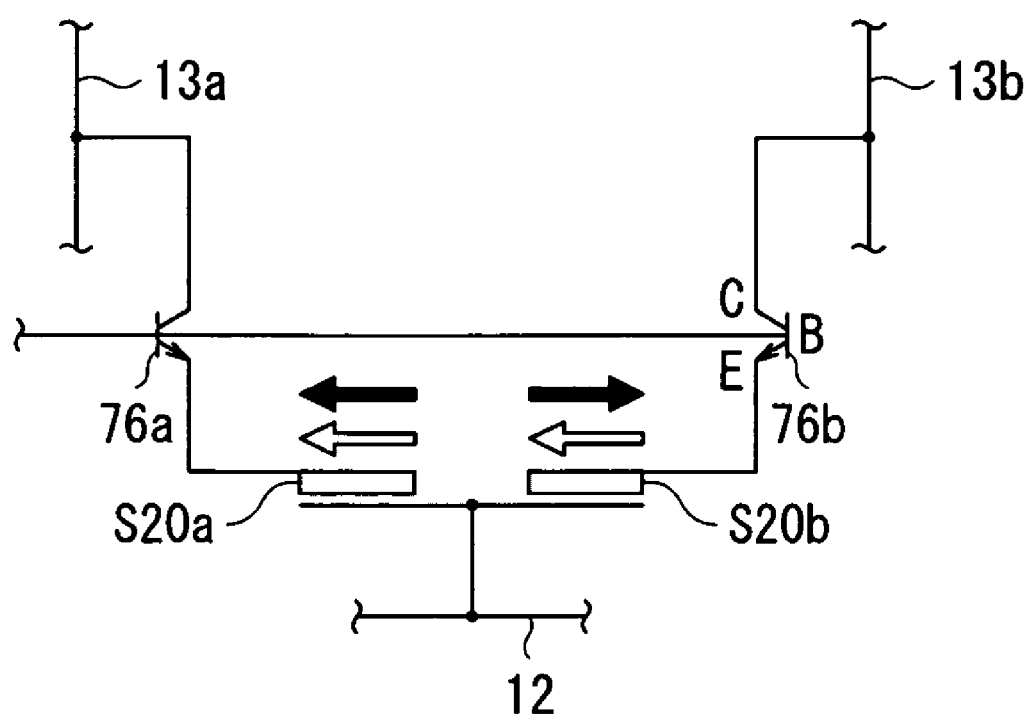
F I G. 32

MAGNETIC STORAGE CELL, MAGNETIC MEMORY DEVICE AND MAGNETIC MEMORY DEVICE MANUFACTURING METHOD

TECHNICAL FIELD

The present invention relates to a magnetic storage cell which includes a magneto-resistive device, a magnetic memory device which includes a plurality of magnetic storage cells, and stores and reads information, and its manufacturing method.

BACKGROUND ART

Conventionally, as general-purpose memories used in information processors such as computers or communications devices, volatile memories such as DRAMs (Dynamic Random Access Memories) or SRAMs (Static RAMs) are used. It is necessary to constantly supply a current to the volatile memories for maintaining memory and to perform refresh. When power is off, the volatile memories lose all information, so it is necessary to provide non-volatile memories for storing information in addition to the volatile memories, and as the non-volatile memories, flash EEPROMs, magnetic hard disk drives and the like are used.

As information processing becomes faster, an increase in the access speed of the non-volatile memories is an important issue. Moreover, the development of information devices for so-called ubiquitous computing, which means computing everywhere at anytime, has been rapidly advanced according to the rapid spread of mobile information devices and the enhancement of the performance of the mobile information devices. The development of non-volatile memories for high speed processing has been strongly desired as key devices which will be the center of the development of such information devices.

As an effective technique for increasing the speed of the non-volatile memories, a magnetic random access memory (hereinafter referred to as MRAM) in which magnetic memory devices each storing information by a magnetization direction along the easy magnetization axis of a ferromagnetic layer are arranged in a matrix form is known. In the MRAM, information is stored through the use of combinations of magnetization directions in two ferromagnets. On the other hand, stored information is read out through detecting a change in resistance (that is, a change in current or voltage) which occurs in the case where the magnetization direction is parallel to a reference direction and the case where the magnetization direction is antiparallel to the reference direction. As the MRAM operates on such a principle, in order to stably write or read information, it is important for MRAM to have as large a MR ratio as possible.

A currently practical MRAM uses a giant magneto-resistive (GMR) effect. The GMR effect is a phenomenon that in the case where two magnetic layers are disposed so that the directions of the easy magnetization axes of the magnetic layers are parallel to each other, when the magnetization direction of each magnetic layer is parallel to the easy magnetization axis, the resistance is minimum, and when the magnetization direction of each magnetic layer is antiparallel to the easy magnetization axis, the resistance is maximum. As an MRAM using a GMR device capable of obtaining such a GMR effect (hereinafter referred to GMR-MRAM), for example, a technique disclosed in the U.S. Pat. No. 5,343,422 is known.

The GMR-MRAM includes a coercivity difference type (Pseudo spin valve type) and an exchange bias type (spin valve type). In the coercivity difference type MRAM, a GMR device includes two ferromagnetic layers and a non-magnetic layer sandwiched between the ferromagnetic layers, and information is written and read out through the use of a difference in coercivity between the ferromagnetic layers. In this case, when the GMR device has, for example, the structure of "a nickel-iron alloy (NiFe)/copper (Cu)/cobalt (Co)", the MR ratio of the GMR device is as small as approximately 6 to 8%. On the other hand, in the exchange bias type MRAM, a GMR device includes a fixed layer of which the magnetization direction is fixed by antiferromagnetic coupling to an antiferromagnetic layer, a free layer of which the magnetization direction is changed by an external magnetic field, and a non-magnetic layer sandwiched between the fixed layer and the free layer, and information is written and read out through the use of a difference between the magnetization directions of the fixed layer and the free layer. For example, the MR ratio in the case where the GMR device has the structure of "platinum-manganese (PtMn)/cobalt-iron (CoFe)/copper (Cu)/CoFe" is approximately 10%, which is larger than that in the coercivity difference type MRAM. However, the MR ratio is not sufficient to achieve further improvement in storage speed or access speed.

In order to overcome these issues, an MRAM including a TMR device which uses a tunneling magneto-resistive (TMR) effect (hereinafter referred to TMR-MRAM) has been proposed. The TMR effect is a phenomenon that a tunnel current flowing through an extremely thin insulating layer (a tunnel barrier layer) sandwiched between two ferromagnetic layers is changed according to a relative angle between the magnetization directions of the ferromagnetic layers. When the magnetization directions of the two ferromagnetic layers are parallel to each other, the resistance is minimum, and when they are antiparallel to each other, the resistance is maximum. In the TMR-MRAM, when the TMR device has, for example, the structure of "CoFe/aluminum oxide/CoFe", the MR ratio is as high as approximately 40%, and the resistance is large, so the TMR device easily matches a semiconductor device such as a MOSFET. Therefore, compared to the GMR-MRAM, higher output can be easily obtained, and the improvement in storage capacity or access speed is expected. In the TMR-MRAM, a method of storing information through changing the magnetization direction of a magnetic film of the TMR device to a predetermined direction by a current magnetic field generated through passing a current through a lead is known. As a method of reading stored information, a method of detecting a change in resistance of the TMR device through passing a current in a direction perpendicular to a tunnel barrier layer is known. As techniques regarding the TMR-MRAM, techniques disclosed in the U.S. Pat. No. 5,629,922, Japanese Unexamined Patent Application Publication No. Hei 9-91949 and the like are known.

As described above, the MRAM using the TMR effect can achieve higher output than the MRAM using the GMR effect. However, even in the MRAM using the above-described TMR device having an MR ratio of approximately 40%, the output voltage is approximately a few tens of mV, so it is not sufficient to achieve a magnetic memory device with a higher density.

FIG. 40 shows a plan view describing the structure of a conventional magnetic memory device using the TMR effect, and FIG. 41 shows a sectional view of a main part of the conventional magnetic memory device corresponding to FIG. 40. A read word line 112 and a write word line 106, and a write bit line 105 are orthogonal to each other, and a TMR device 120 including a first magnetic layer 102, a tunnel barrier layer 103 and a second magnetic layer 104 is disposed between the read word line 112 and the write word line 106, and the write bit line 105 at an intersection of them. In such a MRAM in which the write bit line 105 and the write word line 106 are orthogonal to each other, the magnetization direction of the second magnetic layer 104 which is a free layer cannot be sufficiently aligned, so it is difficult to perform sufficiently stable writing.

In the MRAM using the TMR effect, the magnetization direction of the magnetic film is changed by an induced magnetic field by a current flowing through leads orthogonal to each other, that is, a current magnetic field, thereby information is stored in each storage cell. However, the current magnetic field is an open magnetic field (a magnetic field which is not magnetically trapped in a specific region), so the efficiency is low, and an adverse influence on adjacent storage cells is concerned. Moreover, in the case where the density of the magnetic memory device is further increased through further increasing the packing density of storage cells, it is necessary to reduce the size of the TMR device; however, the following issue is concerned. It is considered that when the aspect ratio (thickness/width in a in-plane direction of a laminate) of each magnetic layer in the TMR device increases, a demagnetization direction increases, and the magnitude of a magnetic field for changing the magnetization direction of the free layer increases, thereby a large write current is necessary.

DISCLOSURE OF THE INVENTION

In view of the foregoing, it is a first object of the invention to provide a magnetic memory device capable of reducing a loss of a magnetic field generated by a current flowing through a write line so as to perform stable writing, and a magnetic storage cell included in the magnetic memory device. It is a second object of the invention to provide a magnetic memory device having little adverse influence on an adjacent magnetic storage cell, and a magnetic storage cell included in the magnetic memory device. Moreover, it is a third object of the invention to provide a method of easily manufacturing such a magnetic memory device.

A magnetic storage cell according to the invention includes: a pair of magneto-resistive devices each of which includes: a laminate including a magnetic sensitive layer of which the magnetization direction is changed by an external magnetic field and allowing a current to flow therethrough in a direction perpendicular to a laminate surface; a toroidal magnetic layer disposed on one surface of the laminate so that a direction along the laminate surface is an axial direction and a plurality of leads penetrate the toroidal magnetic layer; wherein the pair of magneto-resistive devices share a part of the toroidal magnetic layer between them. Herein, "an external magnetic field" in the invention means a magnetic field generated by a current flowing through a plurality of leads, or a circulating magnetic field generated in the toroidal magnetic layer. Moreover, "toroidal" in "a toroidal magnetic layer" shows a state where the toroidal magnetic layer is magnetically and electrically continuous, and the plurality of leads penetrating through the interior of the toroidal magnetic layer are completely surrounded with the toroidal magnetic layer, and the sectional surface of the toroidal magnetic layer in a direction across the plurality of leads is closed. Therefore, the toroidal magnetic layer is allowed to include an insulator as long as it is magnetically and electrically continuous. In other words, the toroidal magnetic layer does not include an insulator through which no current flows; however the toroidal magnetic layer may include an oxide film to an extent in which the formation of the oxide film occurs in a manufacturing process. Moreover, "an axial direction" indicates an opening direction when attention is given to the toroidal magnetic layer, that is, an extending direction of the plurality of leads penetrating through the interior of the toroidal magnetic layer. Moreover, "disposed on one surface of the laminate" means that a part of the toroidal magnetic layer includes the laminate. Further, "share" indicates the state where a pair of toroidal magnetic layers are electrically and magnetically continuous.

In the magnetic storage cell according to the invention, a pair of closed magnetic paths of which a part is shared between them can be formed through flowing currents through a plurality of leads by the above-described structure, and compared to the case where an independent toroidal magnetic layer is disposed in each magneto-resistive device, the magnetization of each magnetic sensitive layer in a pair of magneto-resistive devices can be reversed efficiently.

A magnetic memory device according to the invention includes: a first write line; a second write line extending so as to intersect with the first write line; and a magnetic storage cell including a pair of magneto-resistive devices, wherein the pair of magneto-resistive devices each include: a laminate including a magnetic sensitive layer of which the magnetization direction is changed by an external magnetic field and allowing a current to flow therethrough in a direction perpendicular to a laminate surface; a toroidal magnetic layer disposed on one surface of the laminate so that a direction along the laminate surface is an axial direction and the first write line and the second write line penetrate through the toroidal magnetic layer, and the pair of magneto-resistive devices share a part of the toroidal magnetic layer between them.

In the magnetic memory device according to the invention, a pair of closed magnetic paths of which a part is shared between them can be formed through flowing currents through the first write line and the second write line by the above-described structure, and the magnetization of each magnetic sensitive layer in a pair of magneto-resistive devices can be reversed efficiently.

In a magnetic memory device manufacturing method according to the invention, the magnetic memory device includes a first write line, a second write line extending so as to intersect with the first write line, and a magneto-resistive device including a laminate which includes a magnetic sensitive layer of which the magnetization direction is changed by an external magnetic field, and the method includes: a step of forming a pair of laminate portions constituting parts of a pair of the laminates on a substrate on which a pair of rectifying devices are disposed; a step of forming a bottom magnetic layer so that at least the pair of laminate portions are covered with the bottom magnetic layer, and thereby completing the formation of the pair of laminates; a step of forming a pair of the first write lines on the bottom magnetic layer with a first insulating film in between; a step of forming a pair of the second write lines on the pair of first write lines with a second insulating film in between so as to include a portion where the first write lines and the second write lines extend in parallel to each other; a laminate pattern forming step of forming a pair of laminate patterns including a portion where the first write lines and the second write lines extend in parallel to each other through etching and patterning the pair of the second write lines, the second insulating film and the pair of first write lines in order; and a step of forming a pair of toroidal magnetic layers which share a part between them through disposing a top magnetic layer so that the pair of laminate patterns are surrounded with the top magnetic layer with a third insulating film in between, and thereby forming a magnetic storage cell including a pair of the magneto-resistive devices.

In the magnetic memory device manufacturing method according to the invention, by the above steps, a pair of toroidal magnetic layers which share a part between them are formed, so a pair of closed magnetic paths which share a part between them can be formed through flowing currents through the first write line and the second write line, and the magnetization of each magnetic sensitive layer in a pair of magneto-resistive devices can be reversed efficiently. Herein, "the first write line and the second write line are parallel to each other with a second insulating layer in between" includes an error range of ±10° in manufacturing.

In the magnetic storage cell and the magnetic memory device according to the invention, it is preferable that the laminate is electrically connected to the toroidal magnetic layer. Thereby, a current flowing in a direction perpendicular to the laminate surface of the laminate flows from the magnetic sensitive layer to the toroidal magnetic layer.

In the magnetic storage cell according to the invention, a plurality of leads preferably extend in parallel to each other in a region where the plurality of leads penetrate through the toroidal magnetic layer. Thereby, a combined magnetic field generated through flowing currents through the plurality of leads can be larger than that in the case where a plurality of write lines intersect with each other, and the magnetization of the magnetic sensitive layer can be reversed more efficiently.

In the magnetic storage cell according to the invention, it is preferable that the magnetization directions of the magnetic sensitive layers in the pair of magneto-resistive devices are changed by a magnetic field generated by currents flowing through the plurality of leads penetrating through the toroidal magnetic layer so as to be turned in antiparallel to each other, thereby information is stored in the pair of magneto-resistive devices. Herein, "the magnetization directions are antiparallel to each other" includes the case where an relative angle between the magnetization directions, that is, the average magnetization directions of the magnetic layers is strictly 180 degrees, and the case where an angle between the magnetization directions is deviated by a predetermined angle from 180 degrees due to an error generated during manufacturing or an error because the magnetic layers are not perfectly uniaxial. Moreover, "information" generally means binary information representing "0" or "1" in an input/output signal into the magnetic memory device or "High" or "Low" in a current value or a voltage value.

In the magnetic storage cell and the magnetic memory device, information is stored in a state where the magnetization directions of the magnetic sensitive layers in the pair of magneto-resistive devices are antiparallel to each other.

More specifically, it is preferable that either of a first state in which either of the pair of magnetic sensitive layer in the pair of the magneto-resistive devices is magnetized in a first direction, and the other one is magnetized in a second direction which is antiparallel to the first direction, or a second state in which either of the pair of magnetic sensitive layers is magnetized in the second direction and the other one is magnetized in the first direction is selected, thereby information is stored in the magnetic storage cell corresponding to the first state and the second state. At this time, there are two states, that is, the state where the magnetizations of the magnetic sensitive layers in the pair of magneto-resistive devices face each other, and the state where they are opposite to each other, and binary information corresponds to the states.

In the magnetic storage cell according to the invention, the magnetic sensitive layer may constitute a part of the toroidal magnetic layer. Moreover, the magnetic sensitive layer may include a first magnetic sensitive portion and a second magnetic sensitive portion which are magnetically exchange coupled to each other, and the first magnetic sensitive portion may constitute a part of the toroidal magnetic layer. In addition, a first non-magnetic conductive layer for antiferromagnetically coupling between the first magnetic sensitive portion and the second magnetic sensitive portion may be disposed between the first magnetic sensitive portion and the second magnetic sensitive portion.

Moreover, in the magnetic storage cell and the magnetic memory device according to the invention, the second magnetic sensitive portion preferably has a larger coercivity than the first magnetic sensitive portion. Thereby, the magnetization direction of the second magnetic sensitive portion is more stabilized.

Moreover, in the magnetic storage cell and the magnetic memory device according to the invention, each laminate may include a non-magnetic layer, a first magnetic layer stacked on one side of the non-magnetic layer and having a fixed magnetization direction, and the magnetic sensitive layer which is stacked on a side of the non-magnetic layer opposite to the side where the first magnetic layer is disposed and of which the magnetization direction is changed by an external magnetic field, or each laminate may include a non-magnetic layer; a first magnetic layer stacked on one side of the non-magnetic layer and having a fixed magnetization direction; and a second magnetic layer stacked on a side of the non-magnetic layer opposite to the side where the first magnetic layer is disposed and functioning as the second magnetic sensitive portion of which the magnetization direction is changed by an external magnetic field, thereby information is detected on the basis of currents flowing through the laminates. In this case, the first magnetic layer preferably has a larger coercivity than the second magnetic layer. Moreover, an antiferromagnetic third magnetic layer which is exchange coupled to the first magnetic layer may be disposed on a side of the first magnetic layer opposite to a side where the non-magnetic layer is disposed. A fourth magnetic layer which is exchange coupled to the first magnetic layer may be disposed between the first magnetic layer and the non-magnetic layer, and a second non-magnetic conductive layer for antiferromagnetically coupling between the first magnetic layer and the fourth magnetic layer may be disposed between the first magnetic layer and the fourth magnetic layer. In these cases, the non-magnetic layer can be made of an insulating layer which can generate a tunneling effect.

In the magnetic memory device according to the invention, it is preferable that the first write line and the second write line extend in parallel to each other in a region where the first write line and the second write line penetrate through the toroidal magnetic layer. Thereby, a combined magnetic field generated through flowing currents through the first write line and the second write line can be larger than that in the case where the first write line and the second write line intersect with each other, and the magnetization of the magnetic sensitive layer of each magneto-resistive device can be reversed more efficiently.

In the magnetic memory device according to the invention, it is preferable that the magnetization directions of the magnetic sensitive layers in the pair of magneto-resistive devices are changed by a magnetic field generated by currents flowing through the first write line and the second write line penetrating through the toroidal magnetic layer so as to be turned in antiparallel to each other, thereby information is stored in the magnetic storage cell.

The magnetic memory device according to the invention further includes a pair of first read lines which are connected to the pair of magneto-resistive devices, and supply read currents to the magneto-resistive devices, wherein information is read out from the magnetic storage cell on the basis of a current flowing through each of the laminates. In the magnetic storage cell according to the invention, "connected" means the state of being connected at least electrically, and does not always mean the state of being connected directly and physically.

In the magnetic memory device, according to relative magnetization directions of the magnetic sensitive layers in the pair of the magneto-resistive devices, information is read out through the use of a difference between current values in the case where currents flow in a direction perpendicular to the laminate surfaces of the laminates.

With regard to reading of information, it is preferable that read currents are supplied from the pair of the first read lines to the pair of magneto-resistive devices, and information is read out from the magnetic storage cell on the basis of a difference between a pair of read current values. In this system, a read current is differentially outputted, so noises generated in each first read line, or an offset component included in an output value of each magneto-resistive device is cancelled out and removed.

The magnetic memory device according to the invention preferably includes a pair of rectifying devices disposed between the pair of first read lines and the pair of magneto-resistive devices on current paths of read currents supplied to the pair of magneto-resistive device; and a second read line leading the read currents flowing through the pair of magneto-resistive devices to the ground.

In the invention, "rectifying device" is a device which allows a current to flow only in one direction, and prevent a current from flowing in an opposite direction. Moreover, "current path" is the whole path where a read current follows so as to enter, pass through and go out of the magneto-resistive device. The rectifying device has a rectifying function of passing a current only toward a ground direction (on a second read line side) on the above-described current path. By the rectifying device, the sneak of the current from other magnetic storage cell connected to the common second read line toward each magnetic storage cell targeted for reading can be prevented, and the current can be prevented from passing from one magneto-resistive device to the other magneto-resistive device in a magnetic storage cell targeted for reading to reach the first read line. As the rectifying device, a Schottky diode, a PN junction diode, a bipolar transistor, or a MOS transistor is preferable.

Moreover, in the magnetic memory device according to the invention, a plurality of magneto-resistive devices and the toroidal magnetic layer are preferably disposed in order on a substrate on which a plurality of rectifying devices are disposed. In this case, as the rectifying devices, bipolar transistors are used, and the emitter of each bipolar transistor and the magneto-resistive device can be electrically connected to each other. Alternatively, as the rectifying devices, the MOS transistors may be used, and the source of each MOS transistor and the magneto-resistive device may be electrically connected to each other, or each of the rectifying devices may be the Schottky diode, and include a conductive layer and an epitaxial layer in order from a side closer to the substrate, and a Schottky barrier may be formed between the conductive layer and the epitaxial layer.

In the magnetic memory device manufacturing method according to the invention, it is preferable that in the laminate pattern forming step, the second insulating film and the pair of first write lines are selectively etched through the use of the pair of second write lines as masks so as to form the pair of laminate patterns in a self-aligning way. Thereby, processing with high precision can be performed, and the manufacturing steps can be simplified.

BRIEF DESCRIPTION OF THE DRAWINGS

FIGS. 5A through 5C are sectional views of a storage cell taken along a line V-V of FIG. 3;

FIGS. 31A through 31C are sectional views showing main parts of a first modification, a second modification and a third modification of the magnetic memory device shown in FIGS. 29A through 29C;

FIG. 32 is a partially enlarged view showing a modification of a rectifying device in the circuit structure shown in FIG. 8;

BEST MODE FOR CARRYING OUT THE INVENTION

Preferred embodiments of the present invention will be described in more detail below referring to the accompanying drawings.

First Embodiment

At first, referring to FIGS. 1 through 7, the structure of a magnetic memory device according to a first embodiment will be described below.

Figure 1:
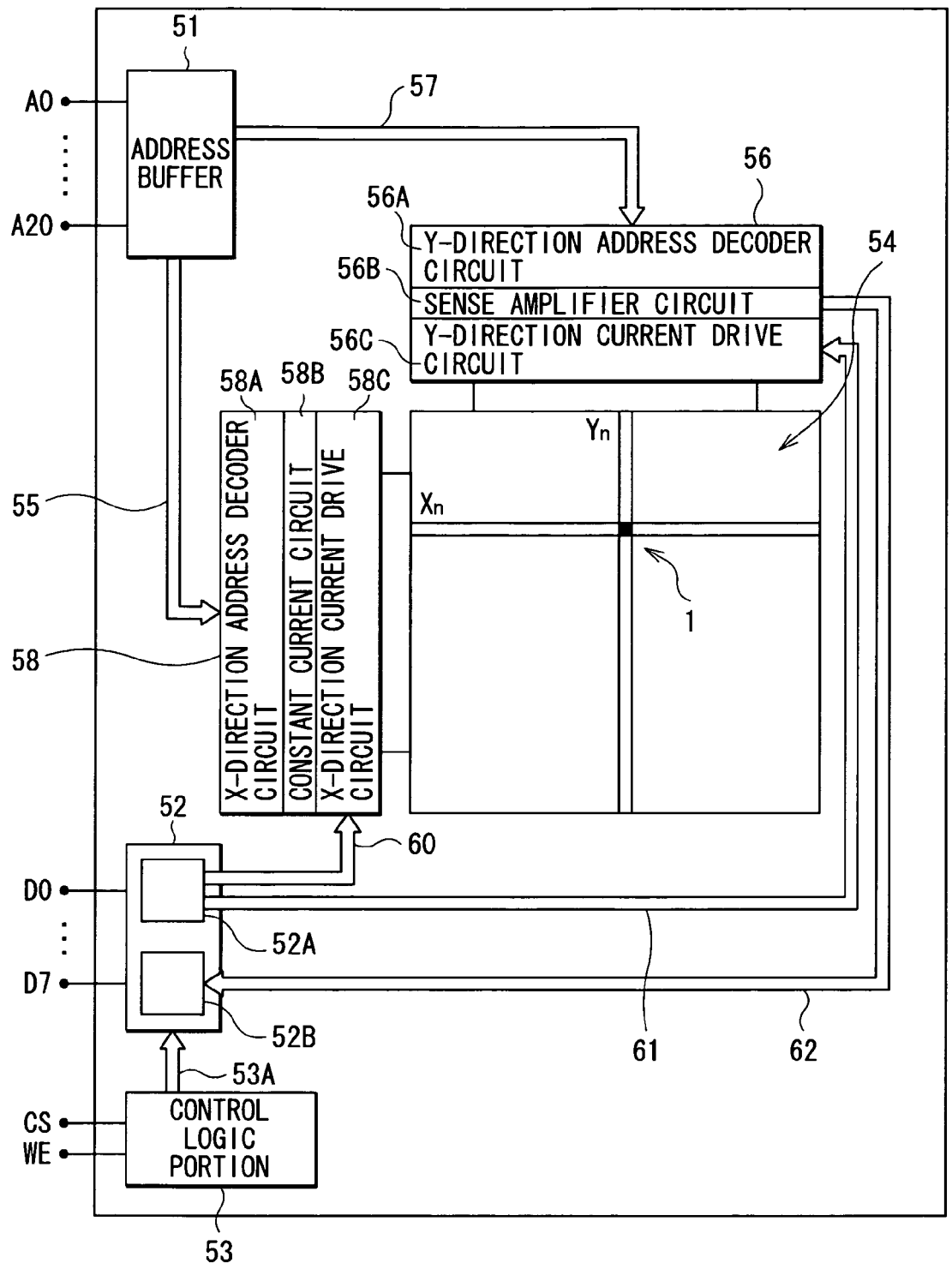
FIG. 1 is a block diagram showing the whole structure of a magnetic memory device according to a first embodiment of the invention.

FIG. 1 is a conceptual illustration showing the whole structure of the magnetic memory device according to the embodiment. The magnetic memory device includes an address buffer 51, a data buffer 52, a control logic portion 53, a storage cell group 54, a first drive control circuit portion 56, a second drive control circuit portion 58, external address input terminals A0 through A20 and external data terminals D0 through D7.

The storage cell group 54 has a matrix structure in which a large number of storage cells 1 each including a pair of tunneling magneto-resistive devices (hereinafter referred to as TMR devices) are arranged in a word line direction (X direction) and a bit line direction (Y direction) orthogonal to each other. The storage cell 1 is a minimum unit for storing data in the magnetic memory device, and corresponds to a specific example of "a magnetic storage cell" in the invention. The storage cell 1 will be described in detail later.

The first drive control circuit portion 56 includes a Y-direction address decoder circuit 56A, a sense amplifier circuit 56B and a Y-direction current drive circuit 56C, and the second drive control circuit portion 58 includes an X-direction address decoder circuit 58A, a constant current circuit 58B and an X-direction current drive circuit 58C.

The Y-direction address decoder circuit 56A and the X-direction address decoder circuit 58A select a word decode line 72 and a bit decode line 71, which will be described later, according to an inputted address signal. The sense amplifier circuit 56B and the constant current circuit 58B are circuits which are driven when performing a read operation, and the Y-direction current drive circuit 56C and the X-direction current drive circuit 58C are circuits which are driven when performing a write operation.

The sense amplifier circuit 56B and the storage cell group 54 are connected to each other through a plurality of bit decode lines 71 through which a sense current flows during the read operation. Likewise, the constant current circuit 58B and the storage cell group 54 are connected to each other through a plurality of word decode lines 72 through which a sense current flows during the read operation.

The Y-direction current drive circuit 56C and the storage cell group 54 are connected to each other through a write bit line 5 which is necessary in the write operation. Likewise, the X-direction current drive circuit 58C and the storage cell group 54 are connected to each other through a write word line 6 which is necessary during the write operation.

The address buffer 51 includes external address input terminals A0 through A20, and is connected to the Y-direction address decoder circuit 56A in the first drive control circuit portion 56 through a Y-direction address line 57, and to the X-direction address decoder circuit 58A in the second drive control circuit portion 58 through an X-direction address line 55. The address buffer 51 takes an address signal from outside from the external address input terminals A0 through A20 to amplify the signal to a voltage level which is necessary in the Y-direction address decoder circuit 56A and the X-direction address decoder circuit 58A by a buffer amplifier (not shown) included in the address buffer 51. Moreover, the address buffer 51 has a function of dividing the amplified address signal into two signals to output one of the signals to the Y-direction address decoder circuit 56A through the Y-direction address line 57 and the other signal to the X-direction address decoder circuit 58A through the X-direction address line 55.

The data buffer 52 includes an input buffer 52A and an output buffer 52B, and further includes external data terminals D0 through D7. The data buffer 52 is connected to the control logic portion 53 so as to be activated by an output control signal 53A from the control logic portion 53. The input buffer 52A is connected to the Y-direction current drive circuit 56C in the first drive control circuit portion 56 and the X-direction current drive circuit 58C in the second drive control circuit portion 58 through a Y-direction write data bus 61 and an X-direction write data bus 60, respectively, and when the write operation is performed on the storage cell group 54, the input buffer 52A has a function of taking a signal voltage from the external data terminals D0 through D7 to amplify the voltage to a necessary voltage level by an internal buffer amplifier (not shown), and then transmitting the amplified voltage to the X-direction current drive circuit 58C and the Y-direction current drive circuit 56C through the X-direction write data bus 60 and the Y-direction write data bus 61. The output buffer 52B is connected to the sense amplifier circuit 56B through a Y-direction read data bus 62, and when an information signal stored in the storage cell group 54 is read out, the output buffer 52B has a function of amplifying an information signal inputted from the sense amplifier circuit 56B by a buffer amplifier (not shown) included in the output buffer 52B and then outputting the signal to the external data terminals D0 through D7 at low impedance.

The control logic portion 53 includes a chip select terminal CS and a write enable terminal WE, and is connected to the data buffer 52. The control logic portion 53 takes a signal voltage from the chip select terminal CS which selects a storage cell group targeted for reading and a storage cell group targeted for writing among a plurality of storage cell groups 54 and a signal voltage from the write enable terminal WE which has a function of outputting a write enable signal to output an output control signal 53A to the data buffer 52.

Next, the structure of the magnetic memory device according to the embodiment relating to an information writing operation will be described below.

Figure 2:
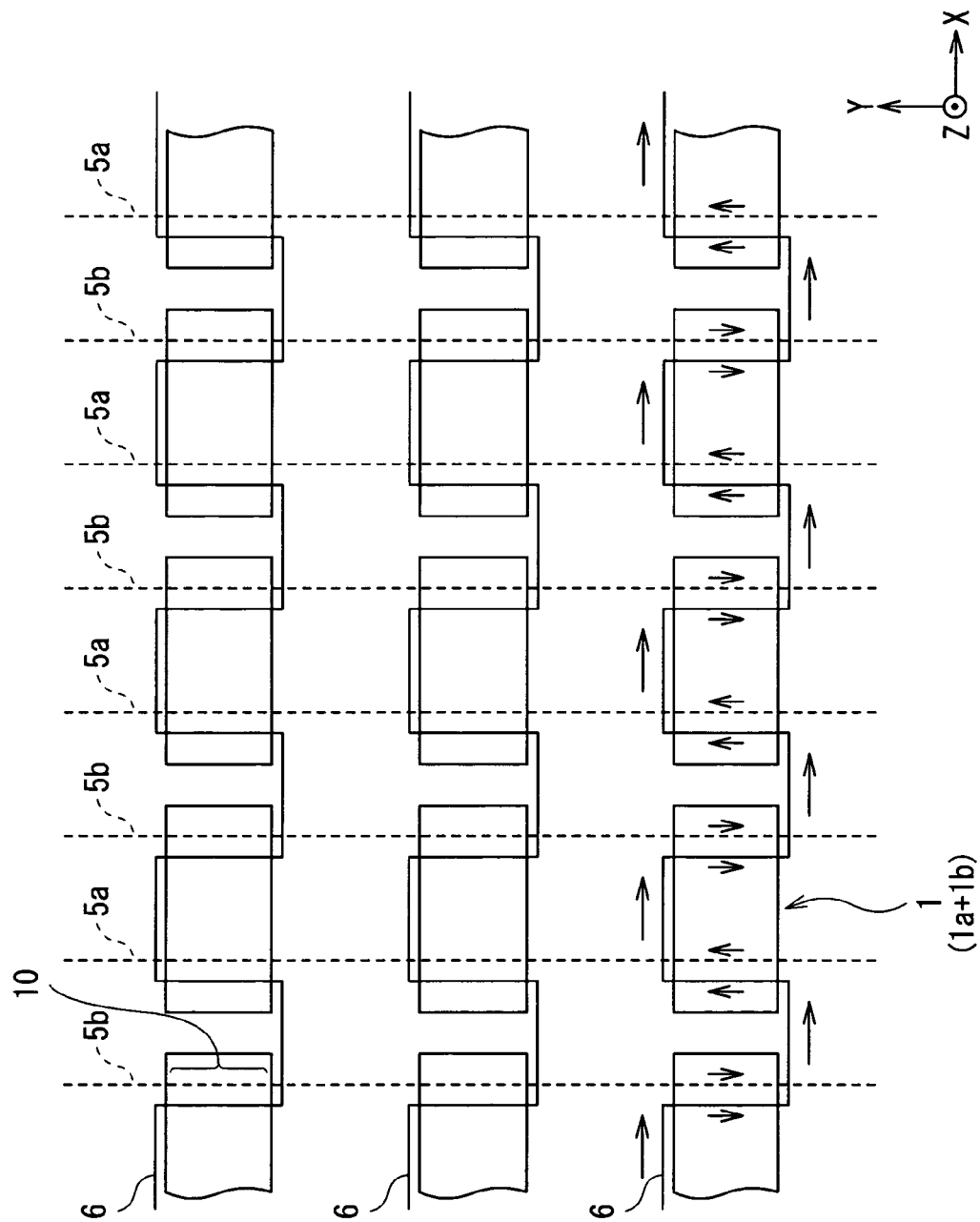
FIG. 2 is a plan view showing the structure of write lines of the magnetic memory device shown in FIG. 1.

FIG. 2 shows a conceptual plan view of a main part of the storage cell group 54 relating to a write operation. As shown in FIG. 2, the magnetic memory device according to the embodiment includes a plurality of write bit lines 5a and 5b and a plurality of write word lines 6 which extend so as to intersect with the plurality of write bit lines 5a and 5b, and includes a parallel portion 10 in which the write bit lines 5a and 5b and the write word lines 6 extend in parallel to each other in each region where the write bit lines 5a and 5b and the write word lines 6 intersect with each other. More specifically, as shown in FIG. 2, while the write word lines 6 extend along an X direction in a rectangular wave pattern, the write bit lines 5a and the write bit lines 5b are alternately arranged, and linearly extend along a Y direction. Rising edge portions and falling edge portions of the write word lines 6 in a rectangular wave pattern form a plurality of parallel portions 10 together with the write bit lines 5a and 5b. The storage cell 1 is disposed in each region where the write bit lines 5a and 5b and the write word lines 6 intersect with each other so that at least a part of each parallel portion 10 is surrounded with the storage cell 1. Disposing the storage cell 1 in an intersection region includes the case where the storage cell 1 is disposed next to an intersection. The storage cell 1 includes a TMR device 1a and a TMR device 1b, and the TMR device 1a is disposed in each region where the write bit line 5a and the write word line 6 intersect with each other, and the TMR device 1b is disposed in each region where the write bit line 5b and the write word line 6 intersect with each other. Herein, the TMR device 1a and the TMR device 1b correspond to a specific example of "a pair of magneto-resistive devices" in the invention.

A current from the Y-direction current drive circuit 58C and a current from the X-direction current drive circuit 56C flow through the write bit lines 5a and 5b and the write word lines 6, respectively. In this case, a current flowing through the write bit line 5a and a current flowing through the write bit line 5b always flow in opposite directions to each other. For example, as shown by arrows in FIG. 2, in the case where the direction of a current through the write bit line 5a is a +Y direction, the direction of a current through the write bit line 5b is a −Y direction. Accordingly, in this case, when the direction of a current flowing through the write word line 6 is a +X direction (from the left to the right in the drawing) as a whole, the direction of a current flowing through the write bit lines 5a and the direction of a current flowing through the write word lines 6 in the TMR device 1a are parallel to each other. Moreover, the direction of a current flowing through the write bit line 5b and the direction of a current flowing through the write word line 6 in the TMR device 1b are parallel to each other. In the case where the current directions in the write bit lines 5a and 5b are not specifically distinguished, hereinafter the write bit lines 5a and 5b are simply referred to as write bit lines 5.

Figure 3:
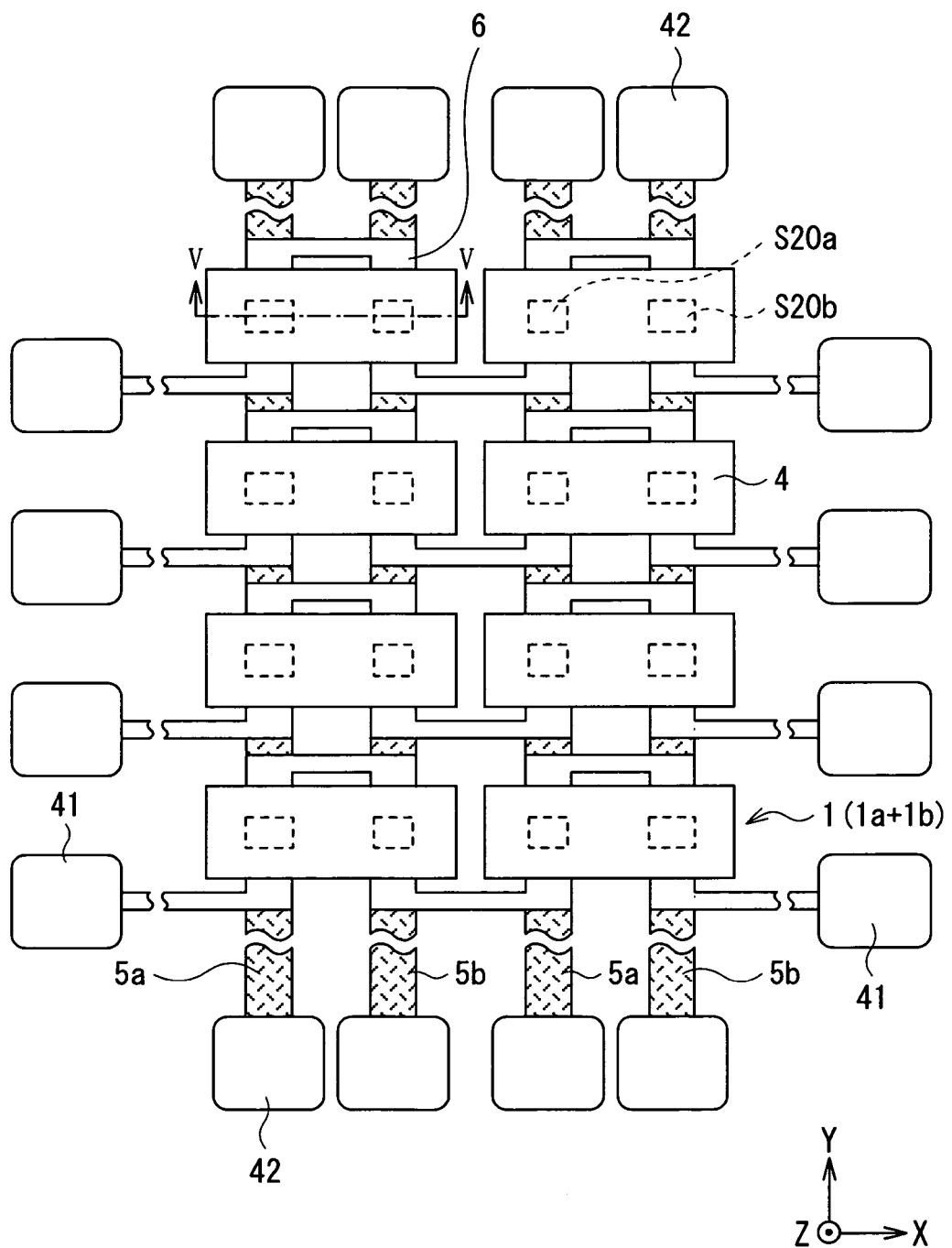
FIG. 3 is a partially plan view showing a main part of a storage cell group of the magnetic memory device shown in FIG. 1.

FIG. 3 shows a plan view of a main part of the storage cell group 54 in more detail. The write bit lines 5a and 5b, the write word lines 6 and the storage cells 1 shown in FIG. 3 correspond to FIG. 2. The storage cell 1 includes the TMR device 1a and the TMR device 1b, and is disposed in the parallel portion 10 where the write bit lines 5a and 5b and the write word lines 6 are parallel to each other along a Y direction. The TMR devices 1a and 1b include a TMR films S20a and S20b and a toroidal magnetic layer 4, and the magnetization direction of the toroidal magnetic layer 4 is changed by a magnetic field generated by currents flowing through the write bit lines 5 and the write word line 6 in the parallel portion 10 (that is, an external magnetic field in the toroidal magnetic layer 4). In this case, the write bit lines 5 and the write word lines 6 in the parallel portion 10 are disposed in a position where they roughly coincide with each other in an XY plane; however, they are disposed so as to have a predetermined spacing in a Z direction, and they are electrically insulated from each other.

Write bit line extraction electrodes 42 are disposed at both ends of each write bit line 5. One of the write bit line extraction electrodes 42 is connected to the Y-direction current drive circuit 56C, and the other write bit line extraction electrode 42 is connected so as to be eventually grounded. Likewise, write word line extraction electrodes 41 are disposed on both ends of each write word line 6. One of the write word line extraction electrodes 41 is connected to the X-direction current drive circuit 58C, and the other write word line extraction electrode 41 is connected so as to be eventually grounded.

Figure 4:
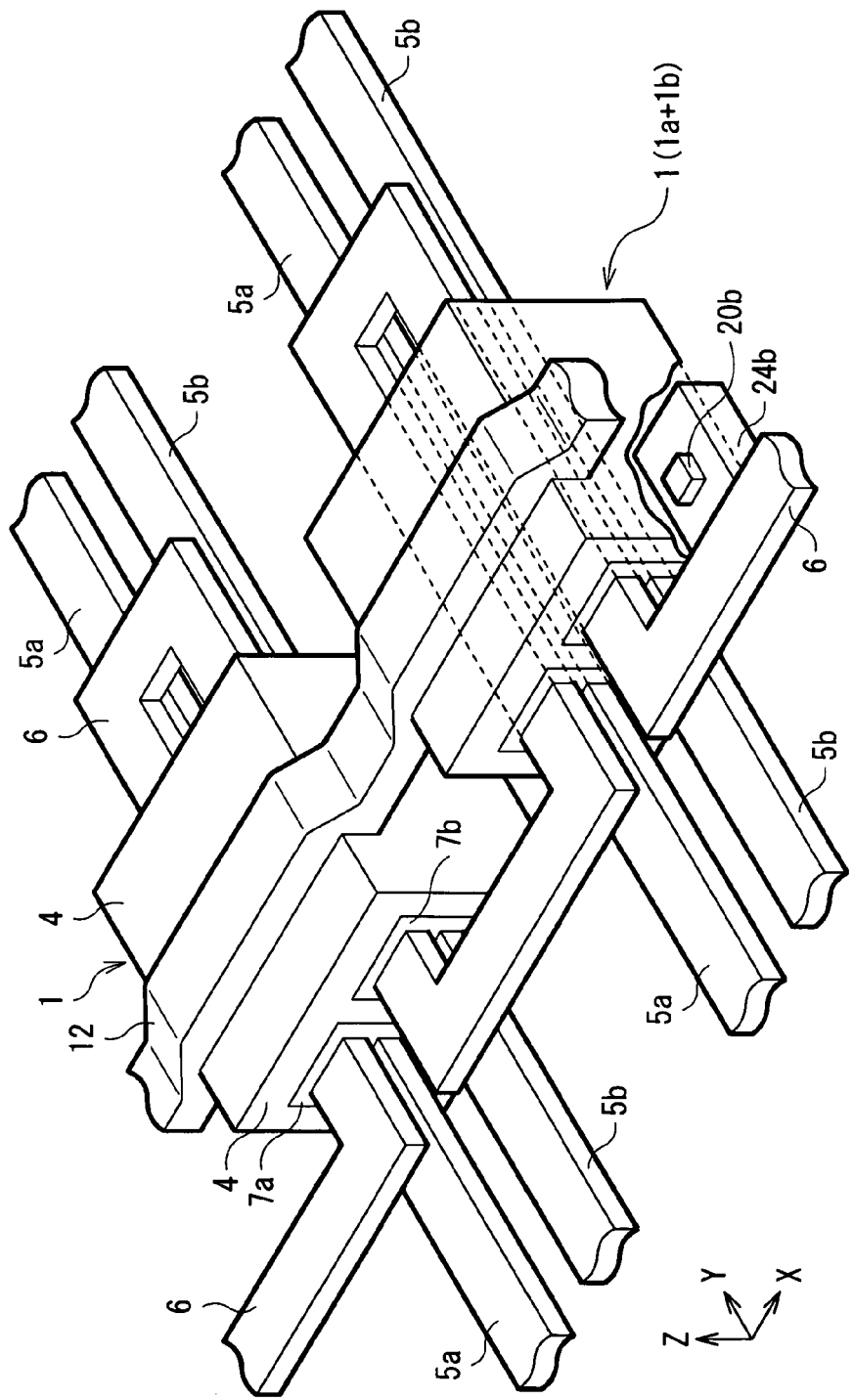
FIG. 4 is a perspective view showing a main part of the storage cell group of the magnetic memory device shown in FIG. 1.

FIG. 4 is an enlarged perspective view of the storage cell 1. As shown in FIG. 4, a laminate portion 20b which is a part of the TMR film S20b is formed on a surface of the toroidal magnetic layer 4 opposite to a surface where the write word line 6 is disposed with the write bit line 5b in between. A read word line 12 is disposed on a surface of the toroidal magnetic layer 4 opposite to the surface where the laminate portion 20b is formed so as to extend in an X direction. The laminate portion 20a which is a part of the TMR film S20a corresponding to the write bit line 5a and the write word line 6 is formed on surfaces of a pair of toroidal magnetic layers 4 which share a part between them, although it is not shown in FIG. 4. The pair of the TMR films S20a and S20b are connected to conductive layers 24a and 24b which are formed opposite to the toroidal magnetic layer 4 (the conductive layer 24a is not shown). The pair of the conductive layers 24a and 24b are parts of a pair of Schottky diodes 75a and 75b (which will be described later), and the other ends of the pair of the Schottky diodes 75a and 75b are connected to the read bit lines 13a and 13b (not shown) which extend in a Y direction. The TMR films S20a and S20b correspond to specific examples of "a laminate" in the invention.

FIG. 5A shows a sectional view of the storage cell 1 taken along a line V-V of FIG. 3 as viewed from an arrow direction.

As shown in FIG. 5A, the storage cell 1 includes a pair of TMR devices 1a and 1b. The TMR device 1a includes the TMR film 20a as a laminate including a magnetic sensitive layer of which the magnetization direction is changed by an external magnetic field, and allowing a current to flow in a direction perpendicular to a laminate surface, and the toroidal magnetic layer 4 which is disposed on one surface of the TMR film S20a so that a direction along the laminate surface is an axial direction and the write bit line 5a and the write word line 6 penetrate through the toroidal magnetic layer 4. On the other hand, the TMR device 1b includes the TMR film S20b as a laminate including a magnetic sensitive layer of which the magnetization direction is changed by an external magnetic field, and allowing a current to flow in a direction perpendicular to a laminate surface, and the toroidal magnetic layer 4 which is disposed on one surface of the TMR film S20b so that a direction along the laminate surface is an axial direction and the write bit line 5b and the write word line 6 penetrate through the toroidal magnetic layer 4. A shared portion 34 which is a part of the toroidal magnetic layer 4 is shared between the pair of the TMR devices 1a and 1b. The magnetic sensitive layers include a pair of connecting portions 14a and 14b which are parts of the toroidal magnetic layer 4 and a pair of second magnetic layers 8a and 8b which will be described later, and the pair of connecting portions 14a and 14b and the pair of second magnetic layers 8a and 8b are magnetically exchange coupled to each other. The connecting portions 14a and 14b correspond to specific examples of "a first magnetic sensitive portion" in the invention, and the second magnetic layers 8a and 8b correspond to specific examples of "a second magnetic sensitive portion" in the invention.

The TMR films S20a and S20b include laminate portions 20a and 20b and connecting portions 14a and 14b, respectively. The laminate portions 20a and 20b include second magnetic layers 8a and 8b functioning as magnetic sensitive layers of which the magnetization directions are changed by an external magnetic field, tunnel barrier layers 3a and 3b, and first magnetic layers 2a and 2b of which the magnetization directions are fixed, respectively, and have a structure in which a current flows through the laminate portions 20a and 20b in a direction perpendicular to the laminate surface. As described above, the second magnetic layers 8a and 8b function as magnetic sensitive layers together with the pair of the connecting portions 14a and 14b of the toroidal magnetic layer 4. Moreover, the write bit lines 5a and 5b and the write word lines 6 are electrically insulated from each other by the insulating films 7a and 7b. In FIGS. 5A and 5B, in order to clearly show the film structures of the TMR films S20a and S20b, the dimensions of the TMR films S20a and S20b are relatively larger than the dimensions of other components.

When the magnetization directions of the pair of the TMR devices 1a and 1b are reversed to directions antiparallel to each other, in the shared portion 34, current magnetic fields generated by the write bit lines 5a and 5b and the write word line 6 are turned to the same direction, so a magnetic flux density increases. Thereby, the current magnetic fields can be used more efficiently, and currents which are necessary to reverse the magnetizations of the connecting portions 14a and 14b of the toroidal magnetic layer 4 and the magnetizations of the second magnetic layers 8a and 8b can be smaller. Moreover, the toroidal magnetic layer 4 is shared, so the pair of TMR devices 1a and 1b can be easily formed, and the area where the storage cell 1 is formed can be reduced, and the storage capacity can be increased.

When a voltage is applied between the first magnetic layers 2a and 2b and the second magnetic layers 8a and 8b in a direction perpendicular to the laminate surface, in the TMR films S20a and S20b, for example, electrons of the first magnetic layers 2a and 2b pass through the tunnel barrier layers 3a and 3b to move to the second magnetic layers 8a and 8b, thereby a tunneling current flows. The tunneling current is changed depending upon a relative angle between the spins of the first magnetic layers 2a and 2b and the spins of the second magnetic layers 8a and 8b in a boundary portion with the tunnel barrier layers 3a and 3b. In other words, in the case where the spins of the first magnetic layers 2a and 2b and the spins of the second magnetic layers 8a and 8b are parallel to each other, the resistance is minimum, and in the case where they are antiparallel to each other, the resistance is maximum. The magnetoresistive ratio (MR ratio) is defined as Formula 1 through the use of the resistance values.

$$(MR\ ratio) = dR/R \quad \text{(Formula 1)}$$

In this case, "dR" is a difference in resistance between the case where the spins are parallel to each other and the case where the spins are antiparallel to each other, and "R" is a resistance value in the case where the spins are parallel to each other.

The resistance value relative to the tunneling current (hereinafter referred to tunneling resistance Rt) is heavily dependent on the thicknesses T of the tunnel barrier layers 3a and 3b. The tunneling resistance Rt increases exponentially with the thicknesses T of the tunnel barrier layers 3a and 3b in a low voltage region as shown in Formula 2.

$$Rt \propto \exp(2\chi^T) \cdot \chi = \{8\pi^2 m^*(\phi \cdot Ef)^{0.5}\}/h \quad \text{(Formula 2)}$$

In this case, "φ" is barrier height; "m*" is electron effective mass; "Ef" is fermi energy; and h is Planck constant. In general, in a memory device using the TMR device, the appropriate amount of the tunneling resistance Rt for matching a semiconductor device such as a transistor is approximately a few tens of kΩ·(μm)$^2$. However, in order to achieve higher density and higher operation speed in the magnetic memory device, the tunneling resistance Rt is preferably 10 kΩ·(μm)$^2$ or less, and more preferably 1 kΩ·(μm)$^2$ or less. Therefore, in order to achieve the above tunneling resistance Rt, the thicknesses T of the tunnel barrier layers 3a and 3b are preferably 2 nm or less, and more preferably 1.5 nm or less.

While the tunneling resistance Rt can be reduced through reducing the thicknesses T of the tunnel barrier layers 3a and 3b, a leakage current is generated due to unevenness of coupling boundaries between the first magnetic layers 2a and 2b and the second magnetic layers 8a and 8b, so the MR ratio declines. In order to prevent a decline in the MR ratio, it is necessary for the thicknesses T of the tunnel barrier layers 3a and 3b to be large enough not to pass a leakage current through the tunnel barrier layers 3a and 3b, and more specifically, the thicknesses T of the tunnel barrier layers 3a and 3b is preferably 0.3 nm or more.

The TMR films S20a and S20b shown in FIG. 5A preferably have a coercivity difference type structure, and the coercivities of the first magnetic layers 2a and 2b are preferably larger than the coercivities of the second magnetic layers 8a and 8b. More specifically, the coercivity of the first magnetic layer 2 is preferably larger than $(50/4\pi) \times 10^3$ A/m, and more preferably $(100/4\pi) \times 10^3$ A/m or more. Thereby, the influence of an undesirable magnetic field such as an external disturbance magnetic field on the magnetization directions of the first magnetic layers 2a and 2b can be prevented. The first magnetic layers 2a and 2b are made of, for example, a cobalt-iron alloy (CoFe) with a thickness of 5 nm. Instead of the cobalt-iron alloy, the simple substance of cobalt (Co), a cobalt-platinum alloy (CoPt), a nickel-iron-cobalt alloy (NiFeCo) or the like can be used for the first magnetic layers 2a and 2b. The second magnetic layers 8a and 8b are made of, for example, the simple substance of cobalt (Co), a cobalt-iron alloy (CoFe), a cobalt-platinum alloy (CoPt), a nickel-iron alloy (NiFe) or a nickel-iron-cobalt alloy (NiFeCo). Moreover, the magnetization easy axes of the first magnetic layers 2a and 2b and the second magnetic layers 8a and 8b are preferably parallel to each other, in order to stabilize the magnetization directions of the first magnetic layers 2a and 2b and the second magnetic layers 8a and 8b in the state where the magnetization directions are parallel or antiparallel to each other.

The toroidal magnetic layer 4 extends so that at least a part of the parallel portion 10 in the write bit lines 5 and the write word lines 6 is surrounded with the toroidal magnetic layer 4, and has a structure in which a circulating magnetic field is generated in the toroidal magnetic layer 4 by a current flowing through the parallel portion 10. The magnetization direction of the toroidal magnetic layer 4 is reversed by the above circulating magnetic field. The connecting portions 14a and 14b of the toroidal magnetic layer 4 and the second magnetic layers 8a and 8b adjacent to the connecting portions 14a and 14b function as storage layers which store information. The toroidal magnetic layer 4 is made of, for example, a nickel-iron alloy (NiFe), and in the case where the coercivities of the connecting portions 14a and 14b is within a range of $(100/4\pi) \times 10^3$ A/m or less, the coercivities of the connecting portions 14a and 14b are preferably smaller than the coercivities of the first magnetic layers 2a and 2b. It is because when the coercivities are larger than $(100/4\pi) \times 10^3$ A/m, the TMR films S20a and S20b may be degraded due to heat generated by an increase in a write current. Moreover, it is because when the coercivities of the connecting portions 14a and 14b are equal to or larger than the coercivities of the first magnetic layers 2a and 2b, a write current increases, and the increased write current causes a change in the magnetization directions of the first magnetic layers 2a and 2b as magnetization fixed layers, thereby the TMR devices 1a and 1b as storage devices are broken. Further, in order to concentrate a current magnetic field by the write bit lines 5 and the write word lines 6 on the toroidal magnetic layer 4, the larger the magnetic permeability of the toroidal magnetic layer 4 is, the more it is preferable. More specifically, the magnetic permeability of the toroidal magnetic layer 4 is preferably 2000 or more, and more preferably 6000 or more.

The write bit lines 5a and 5b and the write word lines 6 each have a structure in which titanium (Ti) with a thickness of 10 nm, titanium nitride (TiN) with a thickness of 10 nm and aluminum (Al) with a thickness of 500 nm are stacked in order, and are electrically insulated from each other by the insulating films 7a and 7b. For example, the write bit lines 5a and 5b and the write word lines 6 each may be made of at least one kind selected from the group consisting of aluminum (Al), copper (Cu) and tungsten (W). The write operation on the storage cell 1 through the use of the write bit lines 5a and 5b and the write word lines 6 will be described in more detail later.

Figure 6:
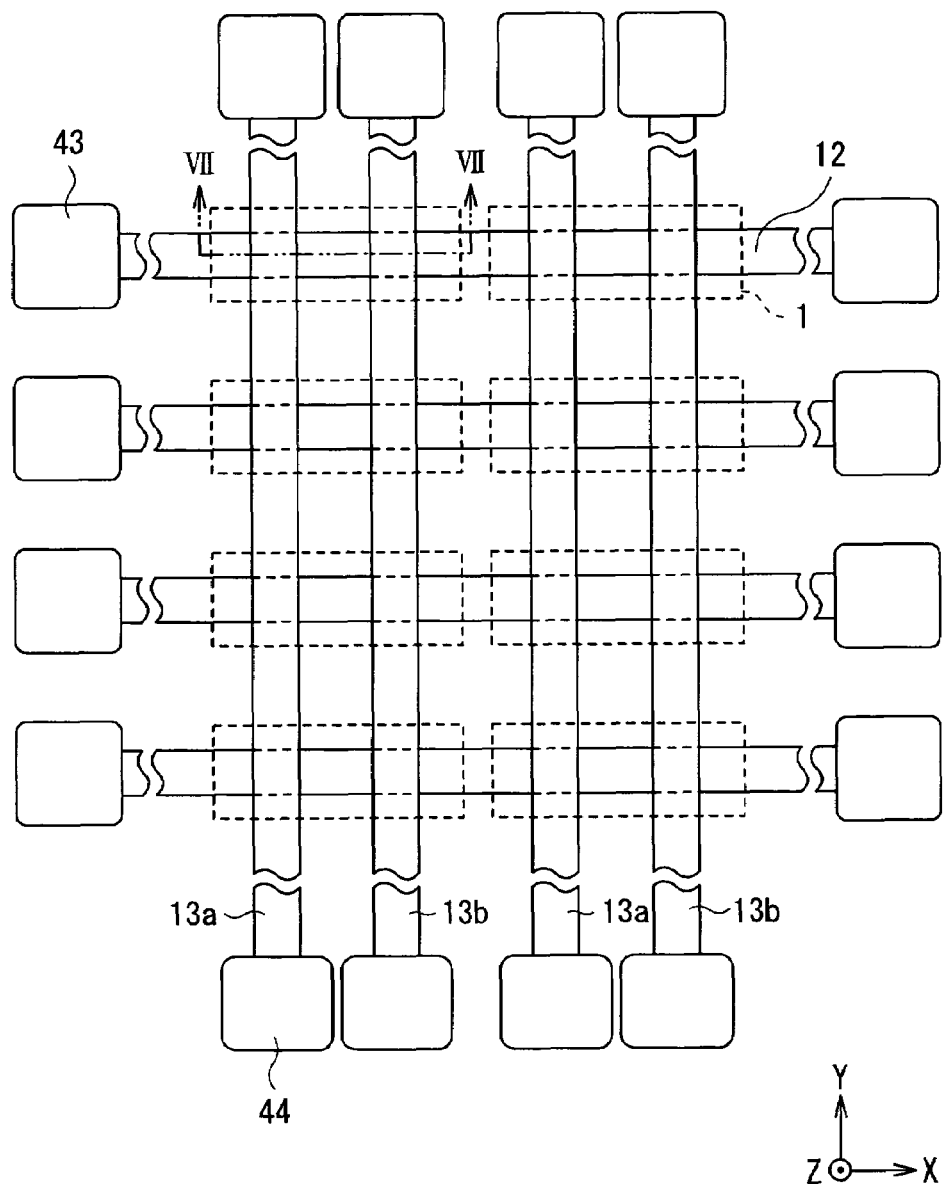
FIG. 6 is a partially plan view showing another main part of the storage cell group of the magnetic memory device shown in FIG. 1.

Next, the structure relating to an information reading operation will be described below. FIG. 6 shows a plan view of a main part relating to a read operation in the storage cell group 54, and corresponds to FIG. 3.

As shown in FIG. 6, each storage cell 1 is disposed at each of intersections of a plurality of read word lines 12 and a plurality of read bit lines 13 in an XY plane. In this case, the bottom surface of the storage cell 1 (a side where the TMR device 20 is formed) border on a pair of read bit lines 13a and 13b with a pair of Schottky diodes 75a and 75b in between, and the top surface (opposite to the TMR films S20a and S20b) border on the read word line 12. The read bit lines 13a and 13b supply a read current to a pair of TMR devices 1a and 1b in each storage cell 1, and the read word line 12 leads the read current flowing through each of the TMR devices 1a and 1b to the ground. Read bit line extraction electrodes 44 are disposed on both ends of each of the read bit lines 13a and 13b. On the other hand, read word line extraction electrodes 43 are disposed on both ends of each read word line 12 herein, the read bit line 13 corresponds to a specific example of "a first read line" in the invention, and the read word line 12 corresponds to a specific example of "a second read line" in the invention.

Figure 7:
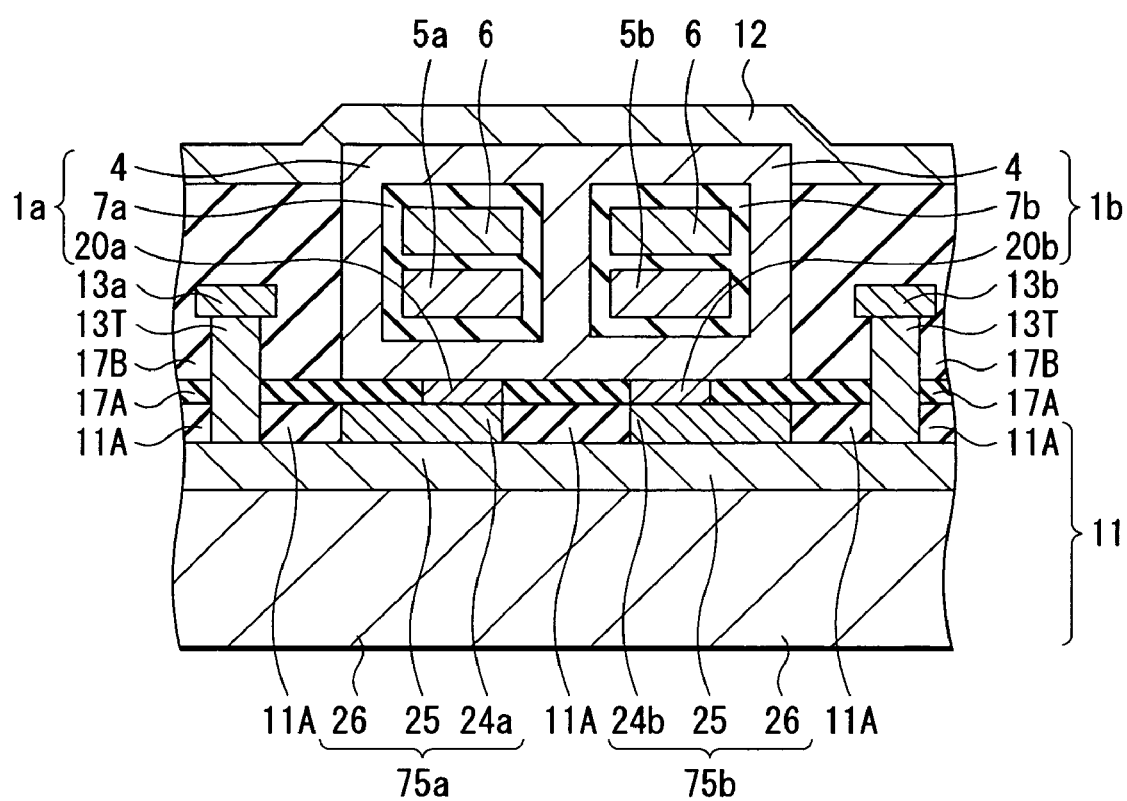
FIG. 7 is a sectional view of the storage cell taken along a line VII-VII of FIG. 6.

FIG. 7 shows a sectional view taken along a line VII-VII of FIG. 6 as viewed from an arrow direction. As shown in FIG. 7, the magnetic memory device according to the embodiment has a structure in which a pair of laminate portions 20a and 20b and the toroidal magnetic layer 4 are stacked in order on a substrate 11 on which a pair of Schottky diodes 75a and 75b (hereinafter simply referred to as diodes 75a and 75b) functioning as rectifying devices are disposed in a region including the storage cell 1.

The pair of diodes 75a and 75b include conductive layers 24a and 24b, an epitaxial layer 25 and a substrate 26 in order from a side closer to the laminate portions 20a and 20b, and a Schottky barrier is formed between the conductive layers 24a and 24b and the epitaxial layer 25. The diode 75a and the diode 75b have a structure in which the diodes 75a and 75b do not include portions electrically connected to each other, except that the diodes 75a and 75b are connected to the toroidal magnetic layer 4 with the laminate portions 20a and 20b in between. The substrate 26 is an n-type silicon wafer. In general, an impurity, P (phosphorus) is diffused into the n-type silicon wafer, and as the substrate 26, an $n^{++}$-type silicon wafer formed through diffusing a high concentration of P (phosphorus) is used. On the other hand, the epitaxial layer 25 is an $n^{-}$-type formed through diffusing a low concentration of P (phosphorus). When the epitaxial layer 25 made of the $n^{-}$-type semiconductor and the conductive layers 24a and 24b made of metal are brought into contact with each other, a band gap occurs to form a Schottky barrier. The pair of diodes 75a and 75b are connected to the read bit lines 13a and 13b with a connecting layer 13T in between.

Next, referring to FIG. 8, a circuit structure relating to the read operation in the magnetic memory device according to the embodiment will be described below.

Figure 8:
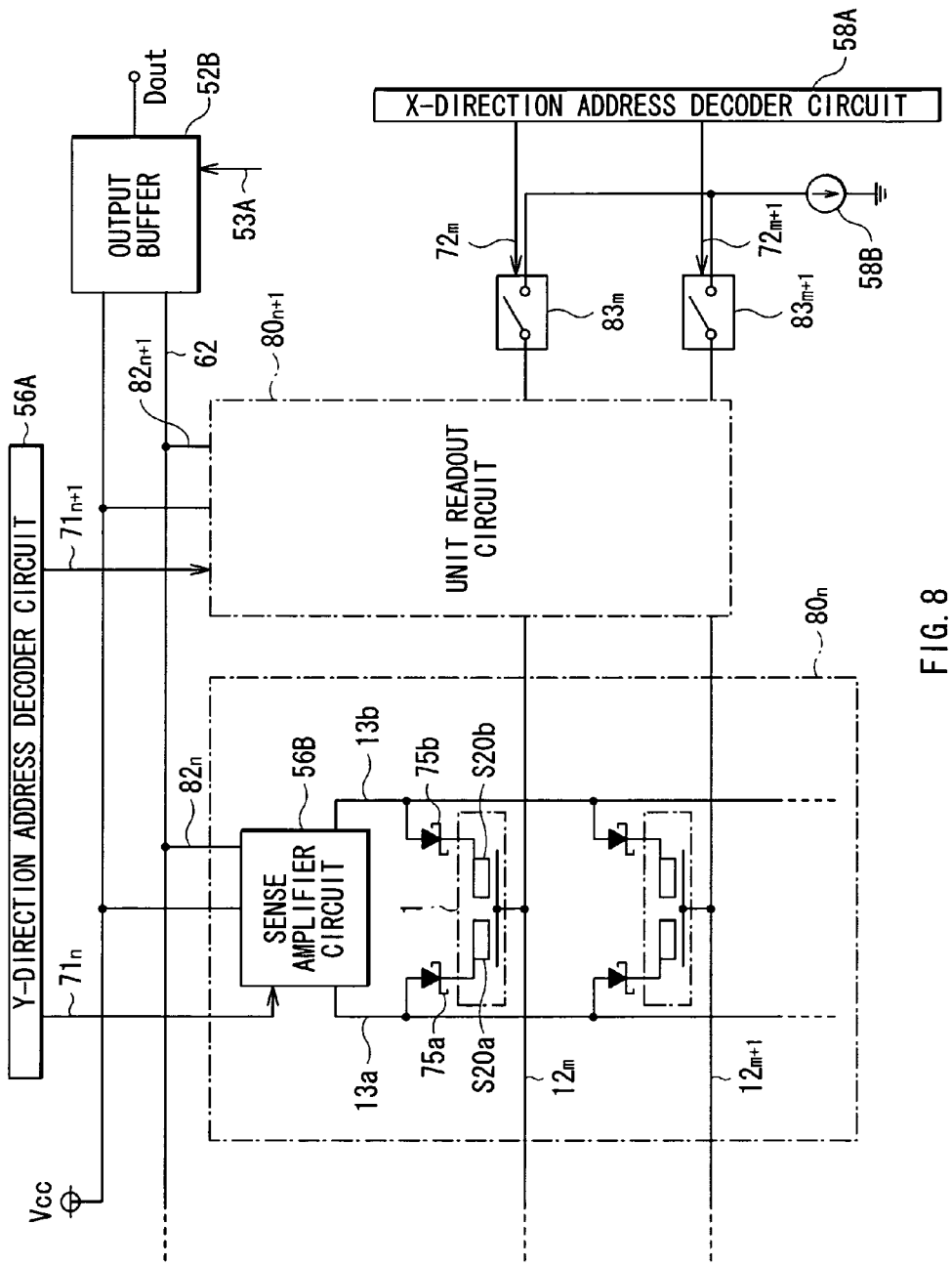
FIG. 8 is a circuit diagram showing the circuit structure of the magnetic memory device shown in FIG. 1.

FIG. 8 shows a structural view of a circuit system including the storage cell group 54 and its readout circuit. The readout circuit system is a differential amplification type in which the storage cell 1 includes a pair of TMR devices 1a and 1b. In this case, the information in each storage cell 1 is read out through outputting the differential value of a read current flowing into the TMR devices 1a and 1b (a current flowing into each of the TMR devices 1a and 1b from the read bit lines 13a and 13b and flowing out to a common read word line 12).

In FIG. 8, the storage cells 1 in each bit array of the storage cell group 54 and a part of the readout circuit including the sense amplifier circuit 56B constitute a unit readout circuit 80 (..., 80n, 80n+1, ...) which is a repeating unit of the readout circuit, and are aligned in parallel to a bit array direction. Each unit readout circuit 80 is connected to the Y-direction address decoder circuit 56A through the bit decode line 71 (..., 71n, 71n+1, ...), and is connected to an output buffer 52B through the Y-direction read data bus 62.

In the storage cell group 54, wiring is carried out in a matrix form with the read word lines 12 (..., 12m, 12m+1, ...) aligned in a Y direction and a pair of read bit lines 13a and 13b aligned in a Y direction. Each storage cell 1 is disposed at each of intersections with the read word lines 12 in a region sandwiched between the pair of read bit lines 13a and 13b. An end of each of the TMR devices 1a and 1b in each storage cell 1 is connected to the read bit lines 13a and 13b with a pair of diodes 75a and 75b, respectively, and the other end of each of the TMR devices 1a and 1b is connected to a common read word line 12.

An end of each read word line 12 is connected to each readout switch ( . . . , 83m, 83m+1, . . . ) with the read word line extraction electrode 43 in between, and is further connected to a common constant current circuit 58B. Each readout switch 83 is connected to the X-direction address decoder circuit 58A through the word decode line 72 ( . . . , 72m, 72m+1, . . . ), and when a selection signal from the X-direction address decoder circuit 58A is inputted into the readout switch 83, the readout switch 83 is brought into conduction. The constant current circuit 58B has a function of making a current flowing through the read word line 12 constant.

An end of each of the read bit lines 13a and 13b is connected to a sense amplifier circuit 56B through the read bit line extraction electrode 44, and the other end of each of the read bit lines 13a and 13b is eventually connected to the ground. One sense amplifier circuit 56B is disposed in each unit readout circuit 80, and has a function of taking a potential difference between a pair of the read bit lines 13a and 13b in each unit readout circuit 80 to amplify the potential difference. Each sense amplifier circuit 56B is connected to an output line 82 ( . . . , 82n, 82n+1, . . . ), and is eventually connected to an output buffer 52B by a Y-direction read data bus 62.

Next, the operation of the magnetic memory device according to the invention will be described below.

At first, referring to FIGS. 2, 5B and 5C, the write operation in the storage cell 1 will be described below. FIGS. 5B and 5C show a relationship between direction of a write current and the direction of a return magnetization field (magnetization direction) in a sectional view of the storage cell 1 shown in FIG. 5A.

FIGS. 5B and 5C show the case where write currents flow in the same direction through the write bit lines 5 and the write word lines 6 which penetrate through the storage cell 1 and are parallel to each other. FIG. 5B corresponds to the direction of a write current shown in FIG. 2. FIG. 5B shows the case where a write current flows through the TMR device 1a in a direction perpendicular to a paper plane from the front to the back (to a +Y direction), thereby a circulating magnetic field 16a is generated in a clockwise direction in a part of the toroidal magnetic layer 4 with which the write bit line 5a is surrounded, and a write current flows in the TMR device 1b in a direction perpendicular to the paper plane from the back to the front (to a −Y direction), thereby a circulating magnetic field 16b is generated in a counterclockwise direction in a part of the toroidal magnetic layer 4 with which the write bit line 5b is surrounded. In this case, the magnetization directions of the connecting portion 14a and the second magnetic layer 8a are turned to a −X direction, and the magnetization directions of the connecting portion 14b and the second magnetic layer 8b are turned to a +X direction. On the other hand, FIG. 5C corresponds to the case where the directions of currents flowing through the write bit lines 5 and the write word lines 6 are completely opposite to those in the case shown in FIG. 5B. More specifically, FIG. 5C shows the case where a write current flows through the TMR device 1a in a direction perpendicular to the paper plane from the back to the front (to a −Y direction), thereby the circulating magnetic field 16a is generated in a counterclockwise direction in a part of the toroidal magnetic layer 4 with which the write bit line 5a is surrounded, and a write current flows through the TMR device 1b in a direction perpendicular to the paper plane from the front to the back (to a +Y direction), thereby the circulating magnetic field 16b is generated in a clockwise direction in a part of the toroidal magnetic layer 4 with which the write bit line 5b is surrounded. In this case, the magnetization directions of the connecting portion 14a and the second magnetic layer 8a are turned to a +X direction, and the magnetization directions of the connecting portion 14b and the second magnetic layer 8b are turned to a −X direction.

The pair of the TMR devices 1a and 1b includes a shared portion 34 which is a part of the toroidal magnetic layer 4, and shared between the TMR devices 1a and 1b. In the cases of FIGS. 5B and 5C, the direction of a current through the TMR device 1a and the direction of a current through the TMR device 1b are opposite to each other, so the directions of the circulating magnetic fields 16a and 16b flowing through the shared portion 34 can be turned to the same direction (to a −Z direction in FIG. 5B and to a +Z direction in FIG. 5C).

As is evident from FIGS. 5B and 5C, according to the directions of the circulating magnetic fields 16a and 16b generated by currents flowing through the write bit lines 5 and the write word lines 6 which penetrate through the toroidal magnetic layer 4, the magnetization directions of the connecting portion 14a and the second magnetic layer 8a and the magnetization directions of the connecting portion 1b and the second magnetic layer 8b are changed so as to be opposite to each other, thereby information can be stored in the storage cell 1.

In other words, when currents flow through the write bit lines 5 and the write word lines 6 in the same direction, the magnetization direction of the second magnetic layer 8 is changed by the reversal of the magnetization direction of the toroidal magnetic layer 4, thereby binary information "0" or "1" can be stored. For example, when the state shown in FIG. 5B, that is, the state where the connecting portion 14a and the second magnetic layer 8a are magnetized in a −X direction, and the connecting portion 14b and the second magnetic layer 8b are magnetized in a +X direction corresponds to "0", and the state shown in FIG. 5C, that is the state where the connecting portion 14a and the second magnetic layer 8a are magnetized in a +X direction, and the connecting portion 14b and the second magnetic layer 8b are magnetized in a −X direction corresponds to "1", information can be stored. Herein, the −X direction corresponds to a specific example of "a first direction" in the invention, and the +X direction corresponds to a specific example of "a second direction" in the invention. Therefore, the state shown in FIG. 5B corresponds to a specific example of "a first state" in the invention, and the state shown in FIG. 5C corresponds to a specific example of "a second state" in the invention.

In this case, in the TMR devices 1a and 1b, when the magnetization directions of the first magnetic layers 2a and 2b and the magnetization direction of the second magnetic layer 8a and 8b are parallel to each other, the TMR devices 1a and 1b are brought into a low resistance state in which a large tunneling current flows, and when they are antiparallel to each other, the TMR devices 1a and 1b are brought into a high resistance state in which a small tunneling current flows. In other words, either of the pair of the TMR devices 1a and the TMR device 1b is always brought into a low resistance state, and the other is always brought into a high resistance state, thereby information is stored. In the case where write currents flow through the write bit line 5 and the write word line 6 in opposite directions, or in the case where a write current flows through only either of them, the magnetization direction of each second magnetic layer 8 is not reversed, thereby data is not rewritten.

Figure 37A:
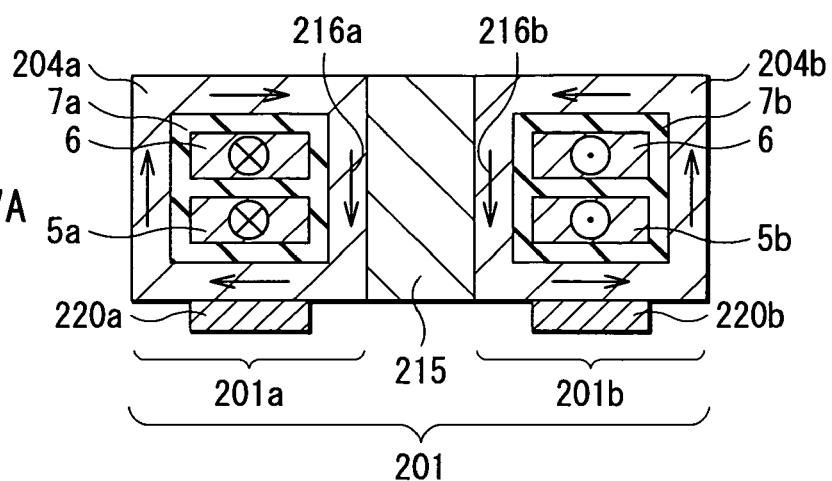
FIGS. 37A and 37B are sectional views for describing a main part of a magnetic memory device as a comparative example relative to the magnetic memory device shown in FIG. 1.
Figure 37B:
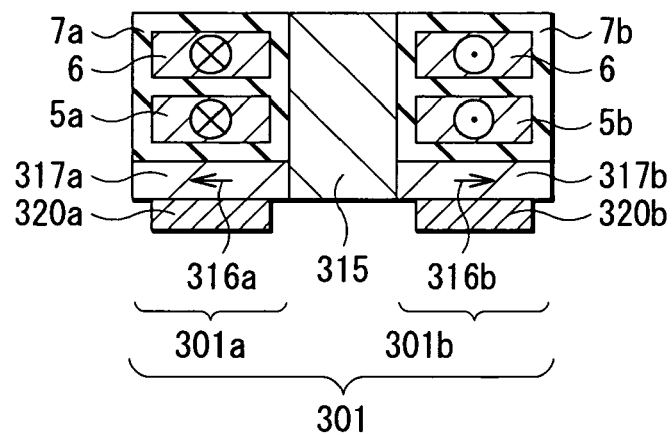

Now, the action of the magnetic memory device according to the embodiment during the write operation will be described compared to a comparative example. FIGS. 37A and 37B show sectional views of storage cells 201 and 301 which are components of a magnetic memory device as a comparative example relative to the embodiment.

In the storage cell 201 shown in FIG. 37A, a TMR device 201a and a TMR device 201b include toroidal magnetic layers 204a and 204b which are separated from each other, respectively. A non-magnetic layer 215 is formed between the toroidal magnetic layer 204a and the toroidal magnetic layer 204b. The components, the dimensions, the materials and the like of the storage cell 201 are the same as those of the storage cell 1, except that the storage cell 201 includes the toroidal magnetic layers 204a and 204b which are separated from each other with the non-magnetic layer 215 in between.

As the storage cell 201 has the above-described structure, a current magnetic field 216a generated by the write word line 6 and the write bit line 5a and a current magnetic field 216b generated by the write word line 6 and the write bit line 5b are induced into the toroidal magnetic layer 204a and the toroidal magnetic layer 204b, respectively, and then the magnetization direction of each magnetic sensitive layer included in each of the TMR films 220a and 220b, and the magnetization directions of parts of the toroidal magnetic layers 204a and 204b in contact with the TMR films 220a and 220b are reversed. As the non-magnetic layer 215 is formed between the toroidal magnetic layer 204a and the toroidal magnetic layer 204b, the magnetic flux of the toroidal magnetic layer 204a and the magnetic flux of the toroidal magnetic layer 204b do not reinforce each other.

The storage cell 301 shown in FIG. 37B has a structure in which no toroidal magnetic layer is included, and a TMR device 301a and a TMR device 301b facing each other with a non-magnetic layer 315 in between are formed on a side opposite to the write word lines 6 and the write bit lines 5a and 5b with non-magnetic layers 317a and 317b in between. The components, the dimensions, the materials and the like of the storage cell 301 are the same as those of the storage cell 1 according to the embodiment, except that no toroidal magnetic layer is included, and the non-magnetic layer 315 is included.

As the storage cell 301 has the above-described structure, a current magnetic field 316a generated by the write word line 6 and the write bit line 5a and a current magnetic field 316b generated by the write word line 6 and the write bit line 5b are not concentrated on a magnetic layer with high magnetic permeability, and reverse the magnetization direction of each magnetic sensitive layer included in the TMR films 320a and 320b with the non-magnetic layer 317a and 317b in between. Therefore, each current magnetic field reaches the other magnetic sensitive layer and a magnetic sensitive layer in an adjacent storage cell, and has, for example, an adverse influence such as a change in the magnetization direction of a magnetic sensitive layer except for a target TMR film in the case where a large write current flows. Moreover, the current magnetic field 316a corresponding to the TMR film 320a and the current magnetic field 316b corresponding to the TMR film 320b are magnetic fields in opposite directions, so they cancel each other out. Therefore, the efficiency of the current magnetic fields declines, and a current for reversing the magnetization direction of each magnetic sensitive layer is increased.

Compared to the above-described storage cells 201 and 301, as shown in FIG. 5, in the storage cell 1 according to the embodiment, a pair of TMR devices 1a and 1b includes the shared portion 34 which is a part of the toroidal magnetic layer 4 shared between the TMR devices 1a and 1b. Therefore, in the case where the direction of a current through the TMR device 1a and the direction of a current through the TMR device 1b are opposite to each other, the directions of the circulating magnetic fields 16a and 16b flowing through the shared portion 34 can be turned to the same direction, thereby the magnetic flux density in the shared portion 34 increases. Thus, the efficiency of the current magnetic fields is improved, and a current which is necessary to reverse the magnetization directions of the second magnetic layer 8a and 8b and the connecting portions 14a and 14b of the toroidal magnetic layer 4 can be reduced. Moreover, as the shared portion 34 is included, the pair of the TMR devices 1a and 1b can be easily formed, and the forming region of each storage cell 1 can be reduced, so a magnetic memory device with a large capacity can be formed in a fixed region.

Next, referring to FIGS. 1, 8 and 9, the read operation in the magnetic memory device will be described below.

At first, one of a plurality of bit decode lines 71 is selected by the Y-direction address decoder circuit 56A in the first drive control circuit portion 56, and a control signal is transmitted to a corresponding sense amplifier circuit 56B. As a result, a read current flows through the read bit lines 13a and 13b, and a positive potential is supplied to the side of the TMR films S20a and S20b in the TMR devices 1a and 1b. Likewise, one of a plurality of word decode lines 72 is selected by the X-direction address decoder circuit 58A in the second drive control circuit portion 58, and a readout switch 83 in a corresponding position is activated. The selected readout switch 83 is brought into conduction, and a read current flows through the corresponding read word line 12, and a negative potential is supplied to a side opposite to the TMR films S20a and S20b in the TMR devices 1a and 1b. Therefore, read currents necessary for reading can flow through one storage cell 1 selected by the Y-direction address decoder circuit 56A and the X-direction address decoder circuit 58A. On the basis of the read currents, the magnetization directions of a pair of the second magnetic layers 8a and 8b are detected, thereby stored information can be read out. In this case, it is important for read currents from the read bit lines 13a and 13b to flow into the storage cell 1 after passing through the diodes 75a and 75b. The reason for this will be described later.

Figure 9A:
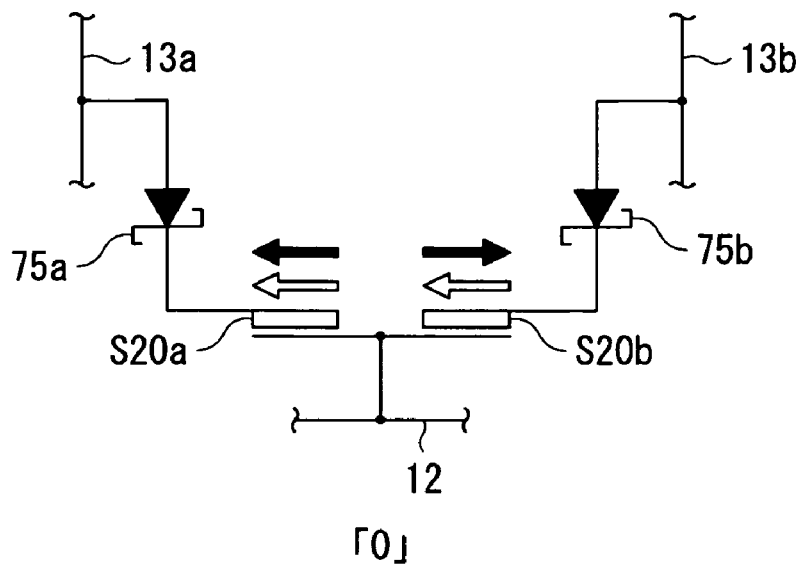
FIGS. 9A and 9B are partially enlarged view of the circuit structure shown in FIG. 8.
Figure 9B:
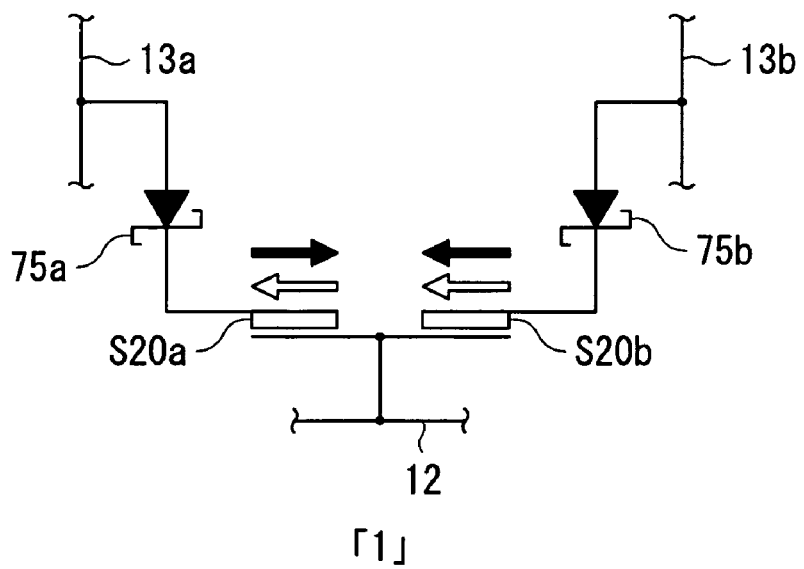

FIGS. 9A and 9B show circuit diagrams of a peripheral portion of the storage cell 1. The magnetization directions of the first magnetic layers 2a and 2b of the TMR films S20a and S20b are shown with white arrows, and the magnetization directions of the second magnetic layers 8a and 8b are shown with black arrows. The magnetization directions of the first magnetic layers 2a and 2b are fixed in a left direction. In FIG. 9A, in the TMR film S20a, the magnetization directions of the first magnetic layer 2a and the second magnetic layer 2b are parallel to each other, and in the TMR film S20b, the magnetization directions of the first magnetic layer 2b and the second magnetic layer 2b are antiparallel to each other. In this case, the TMR film S20a is brought into a low resistance state, and the TMR film S20b is brought into a high resistance state, and the case corresponds to, for example, binary information "0". On the other hand, in FIG. 9B, opposite to the case of FIG. 9A, the TMR film S20a is brought into a high resistance state, and the TMR film S20b is brought into a low state, and the case corresponds to, for example, binary information "1". Such binary information can be read out through detecting a difference between currents flowing through the TMR films S20a and S20b through the use of a difference between the resistances of the TMR films S20a and S20b.

Figure 38:
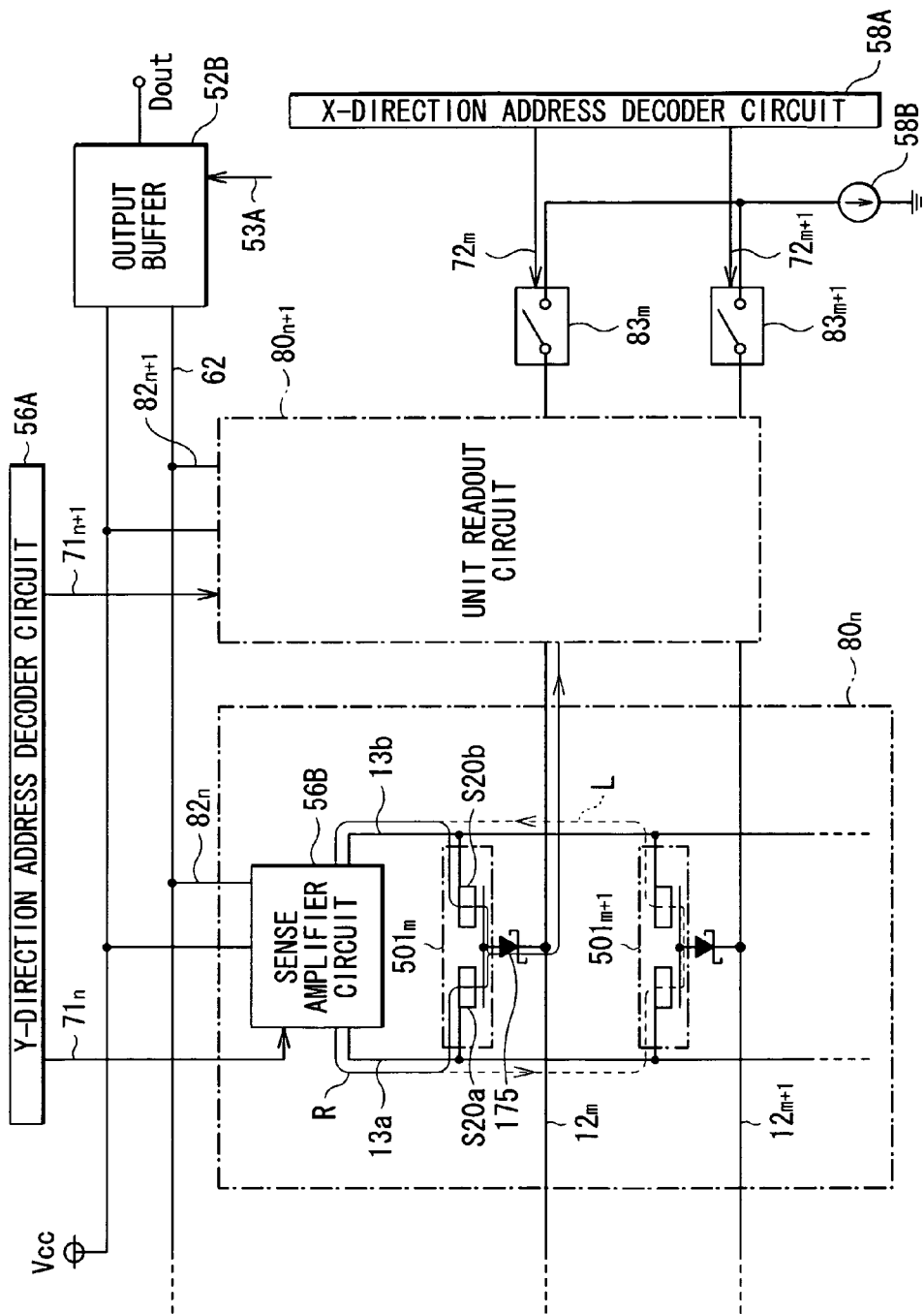
FIG. 38 is a circuit diagram showing a circuit structure as a comparative example corresponding to the circuit structure shown in FIG. 8.
Figure 39:
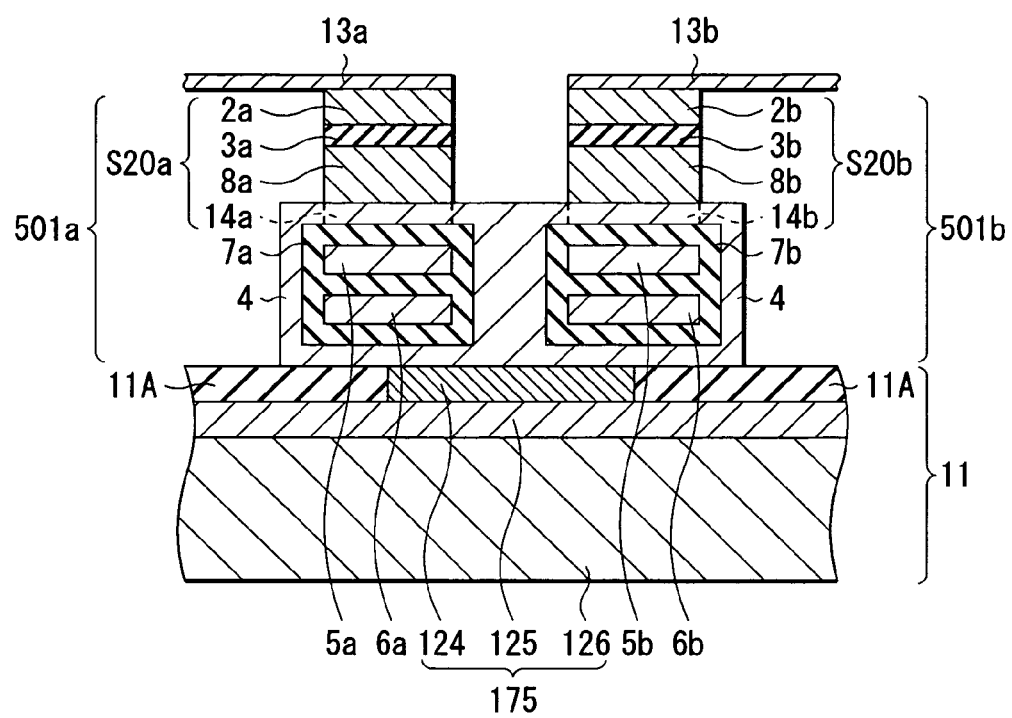
FIG. 39 is a sectional view for describing a main part of a magnetic memory device corresponding to the circuit structure shown in FIG. 38.
Figure 40:
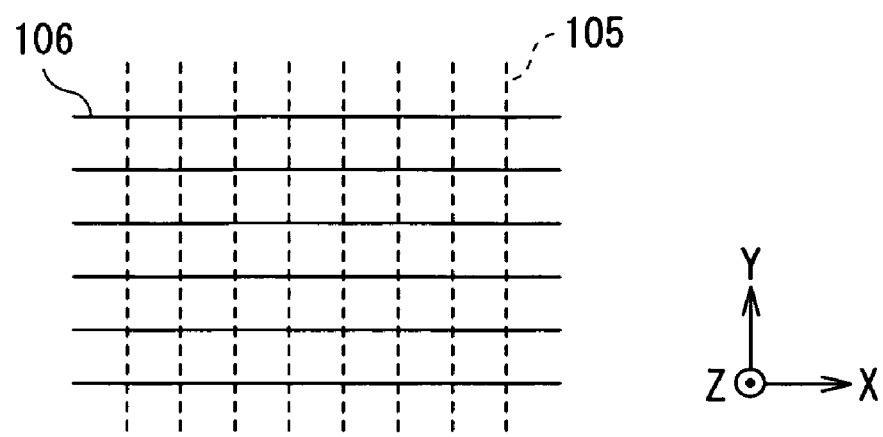
FIG. 40 is a plan view for describing the structure of a magnetic memory device as a conventional example.
Figure 41:
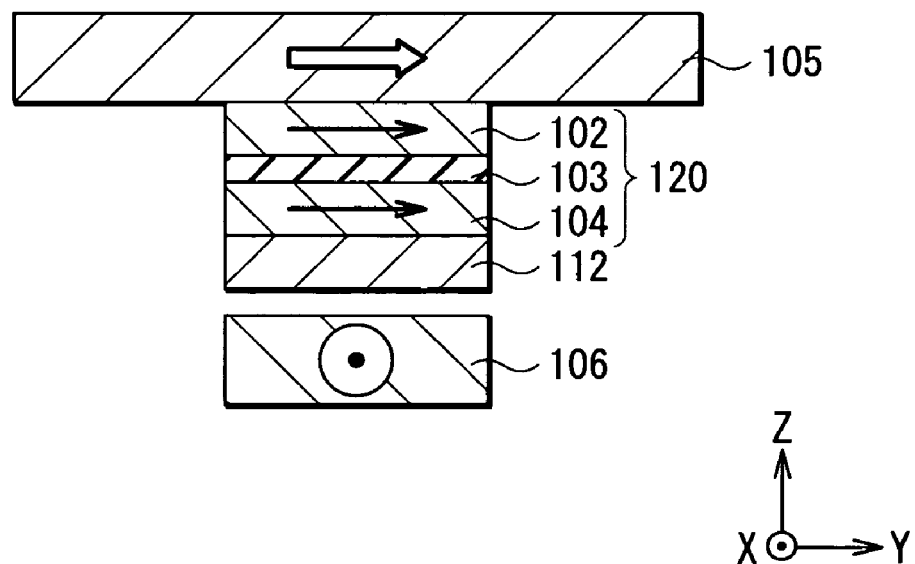
FIG. 41 is a sectional view for describing a main part of the magnetic memory device as the conventional example.

Now, the action of the magnetic memory device according to the embodiment in the read operation will be described compared to a comparative example. FIG. 38 shows a structural view of a circuit system including a storage cell group which include storage cells 501 as a comparative example relative to the embodiment and its readout circuit. FIG. 39 shows a sectional view of the storage cell 501.

In the comparative example shown in FIGS. 38 and 39, one diode 175 is disposed for a pair of TMR films S20a and S20b on a side opposite to the sense amplifier circuit 56B. As shown in FIG. 39, the storage cell 501 includes a pair of TMR devices 501a and 501b, and is formed on the diode 175 buried in a substrate and the top surface of the storage cell 501 is connected to a pair of read bit lines 13a and 13b. More specifically, the storage cell 501 includes the toroidal magnetic layer 4 formed so as to directly come in contact with a conductive layer 124 constituting the diode 175 and a pair of TMR films S20a and S20b in order from the substrate 11, and TMR films S20a and S20b are connected to the read bit lines 13a and 13b. Herein, in the case where a readout switch $83_m$ is selected to read information stored in a storage cell $501_m$, in the comparative example shown in FIGS. 38 and 39, for example, the sneak of a read current which flows along a path L passing through a storage cell $1_{m+1}$ occurs. A path R indicated by a solid line is a normal current path. More specifically, for example, a read current flowing from the sense amplifier circuit 56B to the read bit line 13a flows into the TMR film S20a of the storage cell $501_{m+1}$ which is not selected as a target for reading, and passes through the TMR film S20b via the shared toroidal magnetic layer 4. After that, the read current flows back through the read bit line 13b toward the sense amplifier circuit 56B, thereby the read current meets a read current toward the TMR film S20b of the storage cell $501_m$.

On the other hand, the magnetic memory device according to the embodiment has a sectional structure in which a pair of TMR films S20a and S20b and the toroidal magnetic layer 4 are disposed on the substrate 11 on which a pair of diodes 75a and 75b are disposed. Thereby, the magnetic memory device can have a circuit structure in which a pair of diodes 75a and 75b are disposed between a pair of read bit lines 5a and 5b and a pair of TMR devices 1a and 1b on each current path for read currents supplied to a pair of TMR devices 1a and 1b (the TMR films S20a and S20b of the TMR devices 1a and 1b), and the sneak of an unnecessary current from a storage cell which is not a target for reading can be prevented. In the case where the toroidal magnetic layer, a pair of TMR films, a pair of diodes and a pair of read bit lines are formed in order on a substrate (in which a diode is not buried), the above-described sneak of the read current can be prevented. Moreover, in the toroidal magnetic layer and a pair of TMR films are formed in order on a substrate in which a diode is buried, and the diode and the TMR film can be connected to each other through a metal electrode buried in a via hole.

As described above, the magnetic memory device according to the embodiment includes the TMR devices 1a and 1b each of which includes a plurality of write bit lines 5, a plurality of write word lines 6 extending so as to intersect with the plurality of write bit lines 5, the TMR film 20 including the second magnetic layer 8 of which the magnetization direction is changed by an external magnetic field and allowing a current to flow in a direction perpendicular to a laminate surface, and the toroidal magnetic layer 4 which is disposed on one surface of the TMR film S20 so that a direction along the laminate surface is an axial direction and the write bit line 5 and the write word line 6 penetrate through the toroidal magnetic layer 4, so a closed magnetic path can be formed through flowing currents through the write bit lines 5 and the write word lines 6, and the magnetization of the second magnetic layer 8 in the TMR film S20 can be efficiently reversed, and a magnetic influence on a storage cell adjacent to a storage cell targeted for writing can be reduced. More specifically, a pair of TMR devices 1a and 1b in one storage cell 1 share a part of the toroidal magnetic layer 4 between them, so compared to the case where a part of the toroidal magnetic layer 4 is not shared, and the toroidal magnetic layer 4 is separately disposed, the magnitude of the circulating magnetic field in the closed magnetic path can be reinforced, and the magnetization of the second magnetic layer 8 can be reversed by a smaller write current.

Moreover, the write bit lines 5 and the write word lines 6 extend parallel to each other in a region where they penetrate through the toroidal magnetic layer 4, so a combined magnetic field generated in the toroidal magnetic layer 4 through flowing currents through the write bit lines 5 and the write word lines 6 can be larger than that in the case where these write lines intersect each other, and the magnetization of the second magnetic layer 8 can be reversed by a smaller write current.

Further, the second magnetic layer 8 is disposed between the tunnel barrier layer 3 and the connecting portion 14, so the following advantages can be obtained. Exchange coupling between the connecting portion 14 and the second magnetic layer 8 can be formed, and the magnetization direction of the second magnetic layer 8 as a part of the magnetic sensitive layer is aligned more favorably, thereby writing can be performed more stably. Moreover, the coercivity of the connecting portion 14 can be further reduced, so a heating value can be reduced through reducing a current value during the write operation, and the functions as the magnetic memory device can be fulfilled.

Moreover, the magnetic memory device has a circuit structure in which a pair of diodes 75a and 75b are disposed between a pair of read bit lines 5a and 5b and a pair of TMR devices 1a and 1b on the current paths of read currents supplied to a pair of TMR devices 1a and 1b (the TMR films S20a and S20b of the TMR devices 1a and 1b), so fluctuations by the sneak of the read current, that is, noises in a read signal can be reduced, and magnetic information can be read out stably.

Next, a method of manufacturing the magnetic memory device according to the embodiment with the above-described structure will be described below.

The method of manufacturing the magnetic memory device according to the embodiment includes: a step of forming a pair of laminate portions 20a and 20b which are parts of a pair of TMR films S20a and S20b on the substrate 11 on which a pair of diodes 75a and 75b are disposed so as to correspond to the pair of diodes 75a and 75b; a step of forming the bottom magnetic layer 4B so that at least the pair of laminate portions 20a and 20b are covered with the bottom magnetic layer 4B, thereby completing the formation of the pair of TMR films S20a and S20b; a step of forming a pair of write bit lines 5a and 5b on the bottom magnetic layer 4B with the insulating film 7A in between; a step of forming a pair of write word lines 6 on the pair of write bit lines 5a and 5b with the insulating film 7B in between so as to include a portion where the write bit lines 5a and 5b and the write word lines 6 extend in parallel to each other; a laminate pattern forming step of forming a pair of laminate patterns 19a and 19b including the portion where the write bit lines 5a and 5b and the write word lines 6 extend in parallel to each other through etching and patterning the pair of write word lines 6, the insulating film 7B and the pair of write bit lines 5a and 5b in order; and a step of forming a pair of toroidal magnetic layers 4 which share a part between them through disposing a middle magnetic layer 4S and a top magnetic layer 4U so that the pair of laminate patterns 19a and 19b are surrounded with the middle magnetic layer 4S and the top magnetic layer 4U with insulating films 7C and 7D in between, thereby forming the storage cell 1 including the pair of TMR devices 1a and 1b. The method will be described in more detail below.

Referring to FIGS. 10 through 28, mainly a method of manufacturing the storage cell 1 in the magnetic memory device will be described in detail below. FIGS. 10 through 28 are sectional views corresponding to FIG. 7, and show steps of forming the storage cell 1.

Figure 10:
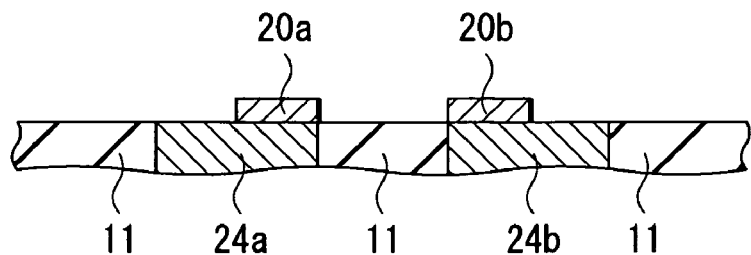
FIG. 10 is an enlarged sectional view showing a step in a method of manufacturing the magnetic memory device shown in FIG. 1.

At first, as shown in FIG. 10, the substrate 11 in which a bipolar transistor is buried is prepared, and a pair of laminate portions 20a and 20b are formed on a pair of conductive layers 24a and 24b buried in the substrate 11. More specifically, at first, a resist pattern is selectively formed by an i-line stepper or the like so that a region except for a region where the laminate portions 20a and 20b are formed is covered with the resist pattern. Next, the first magnetic layer 2 made of, for example, a CoFe layer and an aluminum (Al) layer are formed in order on the whole surface by sputtering or the like. The tunnel barrier layer 3 is obtained through oxidizing the aluminum layer. Moreover, the second magnetic layer 8 made of, for example, a CoFe layer is formed on the tunnel barrier layer 3 by sputtering or the like. A cap layer (protective layer) made of tantalum (Ta) or the like may be further disposed in order to prevent degradation during processing the laminate portions 20a and 20b. Next, the resist pattern is lifted off so as to expose the laminate portions 20a and 20b including the first magnetic layer 2, the tunnel barrier layer 3 and the second magnetic layer 8 which have a predetermined pattern form.

Figure 11:
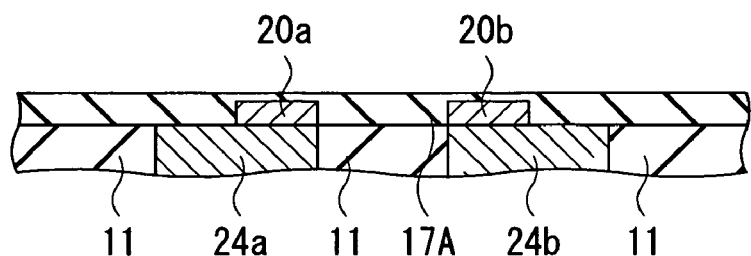
FIG. 11 is an enlarged sectional view showing a step following the step of FIG. 10.

Next, as shown in FIG. 11, the insulating layer 17A made of, for example, silicon oxide ($SiO_2$) is formed by a CVD (Chemical Vapor Deposition) apparatus through the use of, for example, TEOS (tetraethyl orthosilicate; $Si(OC_2H_5)_4$) so that the whole surface is covered with the insulating layer 17A. After that, the insulating layer 17A is annealed under a temperature of 250° C. in a magnetic field of, for example, $(1/\pi) \times 10^6$ A/m to fix the magnetization direction of the first magnetic layer 2.

Figure 12:
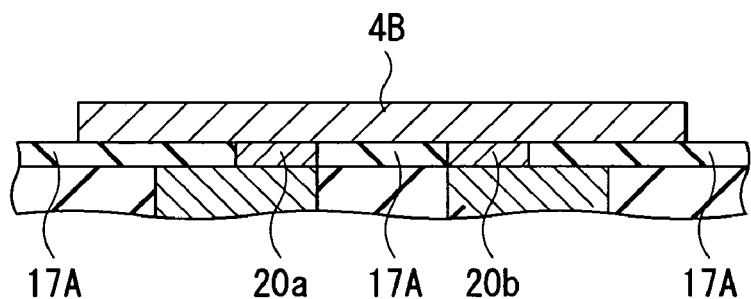
FIG. 12 is an enlarged sectional view showing a step following the step of FIG. 11.
Figure 13:
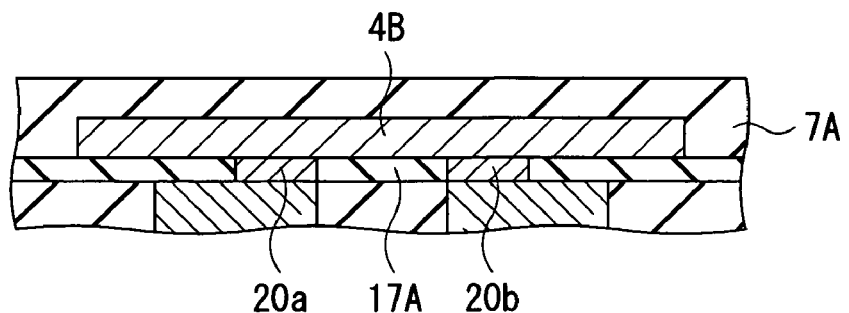
FIG. 13 is an enlarged sectional view showing a step following the step of FIG. 12.

After annealing, the surface of the insulating layer 17A is planarized by, for example, a CMP (Chemical Mechanical Polishing) apparatus so as to expose the top surfaces of the laminate portions 20a and 20b. Moreover, after impurities on the top surfaces of the laminate portions 20a and 20b are removed by reverse sputtering or the like, as shown in FIG. 12, the bottom magnetic layer 4B is selectively formed so that at least the top surfaces of the laminate portions 20a and 20b are covered with the bottom magnetic layer 4B. Thereby, the formation of the TMR films S20a and S20b including a part of the bottom magnetic layer 4B and the laminate portions 20a and 20b is completed tentatively. In this case, after a resist frame (not shown) is selectively formed by photolithography, for example, a NiFe layer is formed on an unprotected region by sputtering or the like, and the resist frame is removed. After the bottom magnetic layer 4B is formed, as shown in FIG. 13, the insulating film 7A made of, for example, $SiO_2$ is formed by the CVD apparatus so that the whole surface is covered with the insulating film 7A. The insulating film 7A corresponds to a specific example of "a first insulating film" in the invention.

Figure 14:
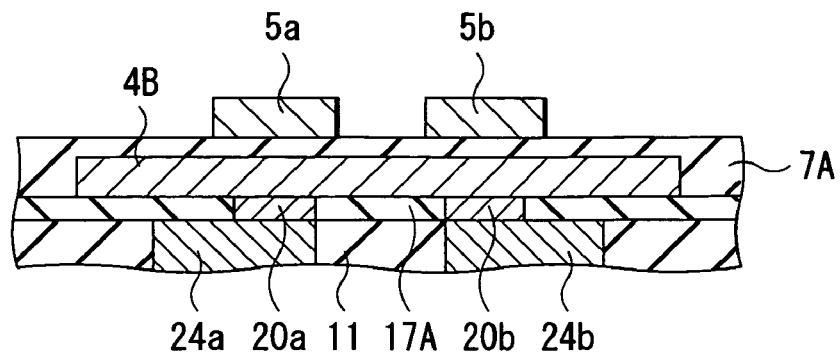
FIG. 14 is an enlarged sectional view showing a step following the step of FIG. 13.

Next, a metal layer made of, for example, titanium (Ti) is formed on the insulating film 7A by sputtering or the like. After that, as shown in FIG. 14, the write bit lines 5a and 5b are selectively formed on the metal layer so that at least a region where the TMR films 20a and 20b are formed is covered with the write bit lines 5a and 5b. More specifically, after a resist pattern (not shown) with a predetermined shape is formed on the insulating film 7A, a plating process using the metal layer as an electrode is performed through immersing the resist pattern in a plating bath to form, for example, a copper (Cu) plating. After the resist pattern is removed, an unnecessary metal layer is removed by ion milling.

Figure 15:
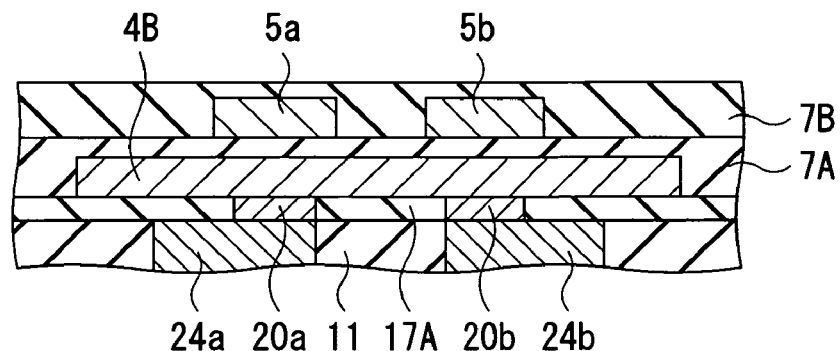
FIG. 15 is an enlarged sectional view showing a step following the step of FIG. 14.

Next, as shown in FIG. 15, the insulating film 7B made of, for example, $SiO_2$ is formed by the CVD apparatus so that the whole surface is covered with the insulating film 7B. After that, the surface of the insulating film 7B is planarized by the CMP apparatus. The insulating film 7B corresponds to a specific example of "a second insulating film" in the invention.

Figure 16:
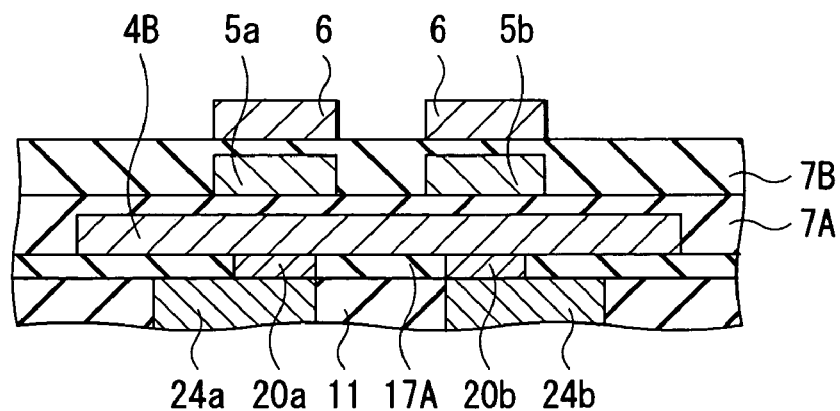
FIG. 16 is an enlarged sectional view showing a step following the step of FIG. 15.

Next, a metal layer made of, for example, titanium (Ti) is formed on the insulating film 7B by sputtering or the like. After that, as shown in FIG. 16, the write word lines 6 are selectively formed so that regions of the metal layer corresponding to the write bit lines 5a and 5b is covered with the write word lines 6. More specifically, after a resist pattern (not shown) with a predetermined shape is formed on the insulating film 7B, a plating process using the metal layer as an electrode is performed through immersing the resist pattern in a plating bath to form, for example, a copper (Cu) plating. After the resist pattern is removed, an unnecessary metal layer is removed by ion milling.

Figure 17:
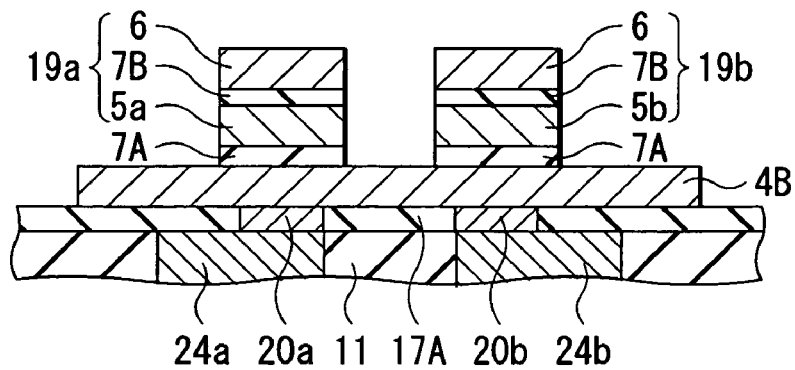
FIG. 17 is an enlarged sectional view showing a step following the step of FIG. 16.

Then, as shown in FIG. 17, laminate patterns 19a and 19b are formed through the use of the write word lines 6 as masks in a self-aligning way. More specifically, the insulating film 7B, the insulating film 7A and the write bit lines 5a and 5b in an region unprotected by the write word line 6 are removed by RIE using $C_4F_8$ as a reactive gas and ion milling, thereby a pair of laminate patterns 19a and 19b are formed. In this case, it is important to remove the insulating film 7A until the bottom magnetic layer 4B is exposed.

Thus, when the laminate patterns 19a and 19b are formed in a self-aligning way through the use of the write word lines 6 as masks, the write bit lines 5a and 5b having the same width as the write word lines 6 can be formed with high precision. Moreover, the step of forming the resist pattern and the step of removing the resist pattern can be omitted, thereby the manufacturing steps can be simplified.

Figure 18:
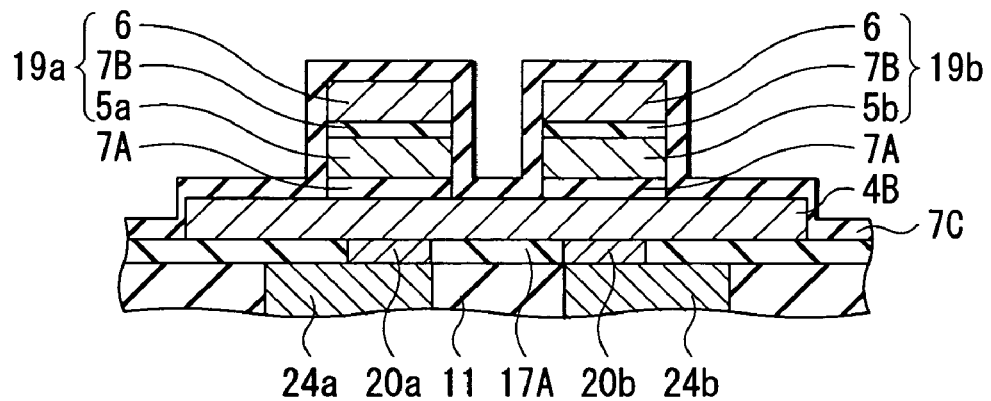
FIG. 18 is an enlarged sectional view showing a step following the step of FIG. 17.

After the laminate patterns 19a and 19b are formed in the parallel portion 10 where the write bit lines 5 and the write word lines 6 are parallel to each other, as shown in FIG. 18, the insulating film 7C made of, for example, $SiO_2$ is formed by the CVD apparatus or the like so that the whole surface is covered with the insulating film 7C.

Figure 19:
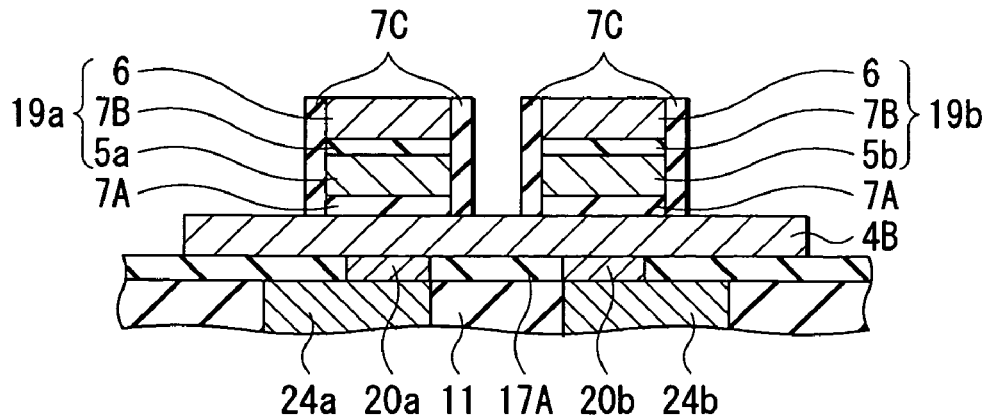
FIG. 19 is an enlarged sectional view showing a step following the step of FIG. 18.
Figure 20:
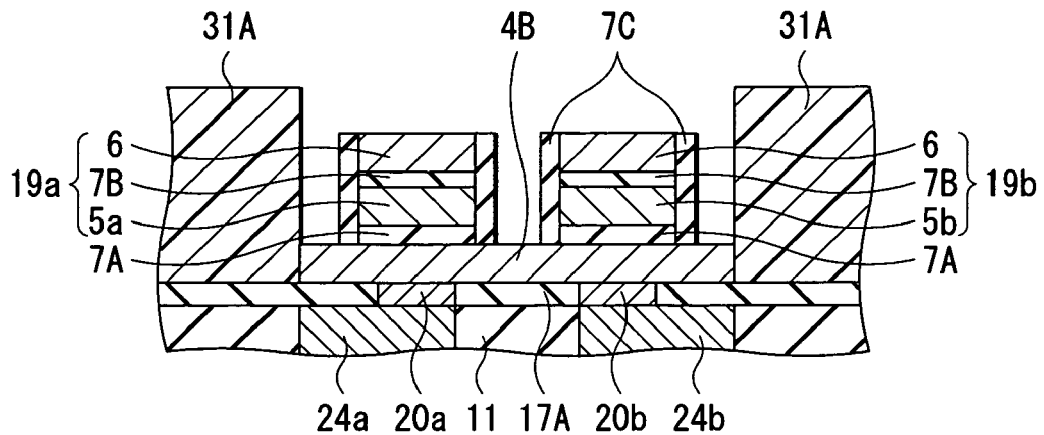
FIG. 20 is an enlarged sectional view showing a step following the step of FIG. 19.

Next, as shown in FIG. 19, after the insulating film 7C except for parts of the insulating film 7C formed on the side surfaces of the laminate patterns 19a and 19b is completely removed by ion milling or the like, a thin metal layer made of, for example, NiFe or the like is formed on the whole surface by sputtering or the like. After that, as shown in FIG. 20, a photoresist layer 31A is formed on a region of the metal layer where the bottom magnetic layer 4B is not formed and which corresponds to the insulating layer 17A by photolithography or the like.

Figure 21:
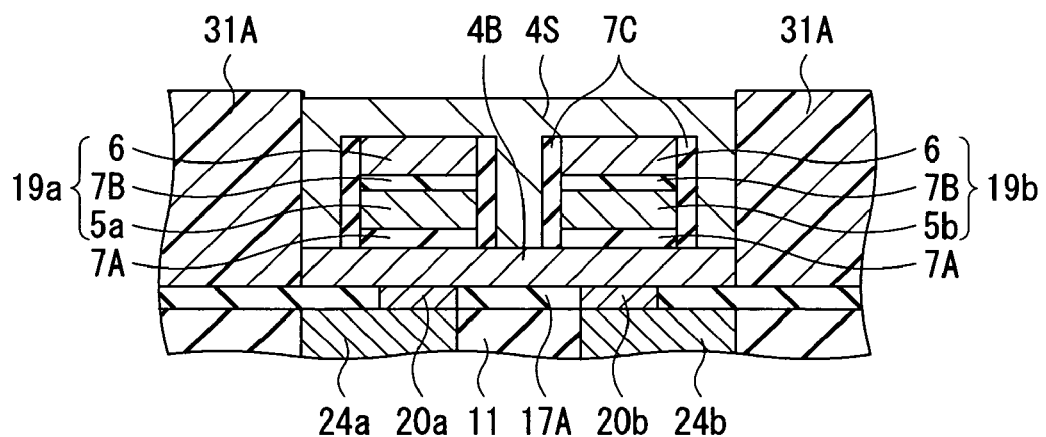
FIG. 21 is an enlarged sectional view showing a step following the step of FIG. 20.
Figure 22:
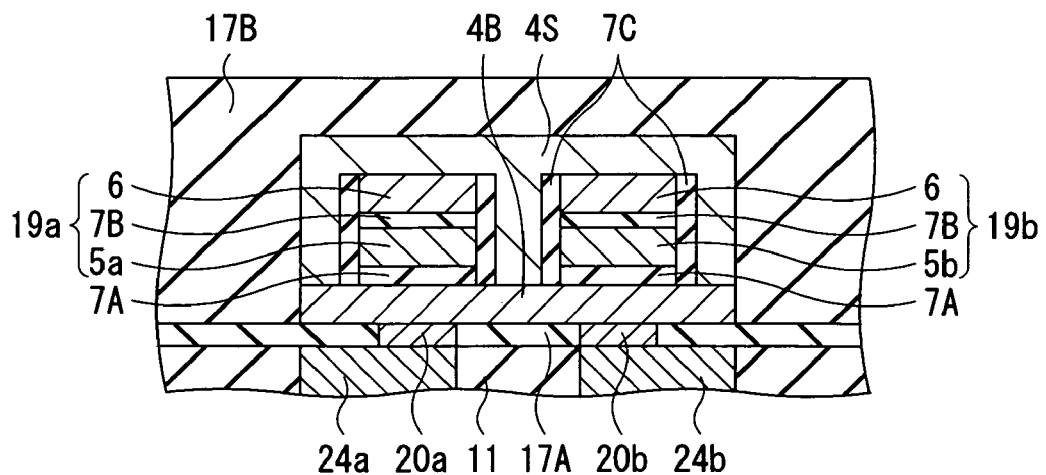
FIG. 22 is an enlarged sectional view showing a step following the step of FIG. 21.

After the photoresist layer 31A is formed, a plating process using the metal layer as an electrode is performed through immersing the metal layer and the photoresist layer 31A in a plating bath, thereby as shown in FIG. 21, the middle magnetic layer 4S made of, for example, NiFe is formed. Next, after the resist pattern is removed, an unnecessary metal layer is removed through ion milling. After that, as shown in FIG. 22, the insulating layer 17B made of, for example, $SiO_2$ is formed by the CVD apparatus or the like so that the whole surface is covered with the insulating layer 17B.

Figure 23:
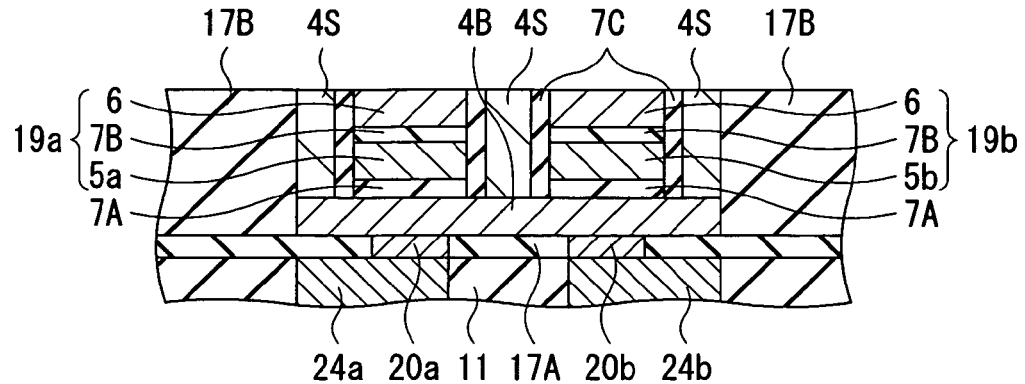
FIG. 23 is an enlarged sectional view showing a step following the step of FIG. 22.
Figure 24:
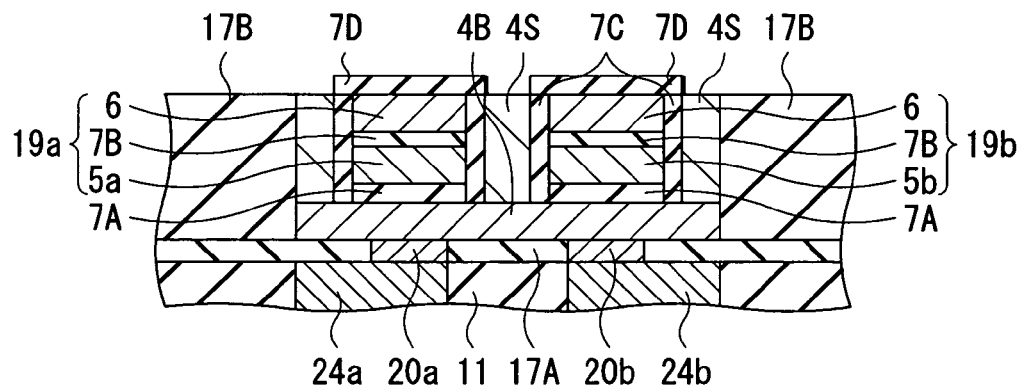
FIG. 24 is an enlarged sectional view showing a step following the step of FIG. 23.
Figure 25:
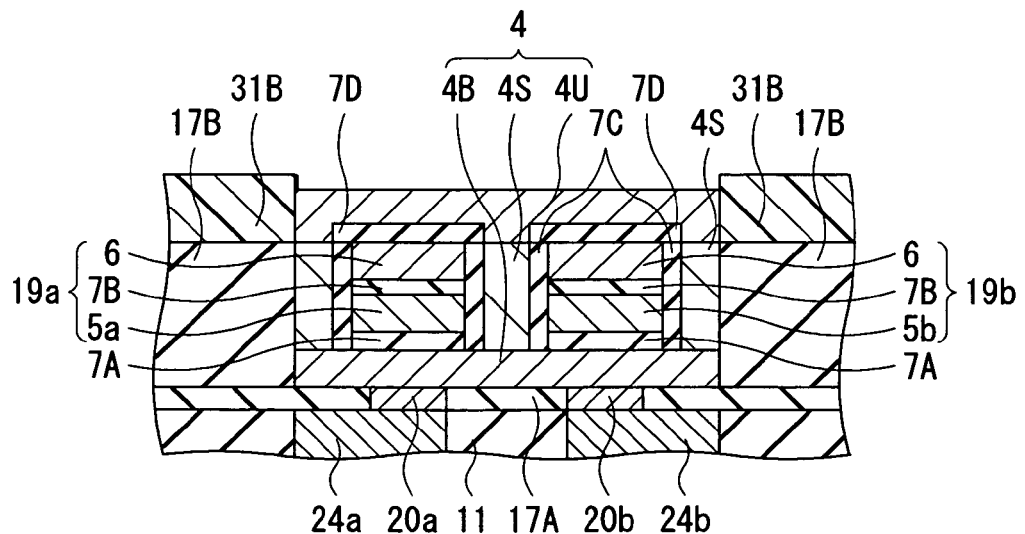
FIG. 25 is an enlarged sectional view showing a step following the step of FIG. 24.

Next, as shown in FIG. 23, polishing is performed by a CMP apparatus until the write word lines 6 are finally exposed. After that, as shown in FIG. 24, an insulating film 7D is selectively formed by photolithography or the like so that an exposed surface of each write word line 6 is covered with the insulating film 7D. Moreover, a thin metal layer made of, for example, NiFe is formed by sputtering or the like. After that, as shown in FIG. 25, a photoresist layer 31B is formed on a region of the metal layer corresponding to the insulating layer 17B by photolithography or the like. After that, a plating process using the metal layer as an electrode is performed through immersing the metal layer and the photoresist layer 31B in a plating bath to form the top magnetic layer 4U made of, for example, NiFe. Thereby, the formation of the toroidal magnetic layer 4 including the bottom magnetic layer 4B, the middle magnetic layer 4S and the top magnetic layer 4U is completed. The middle magnetic layer 4S and the top magnetic layer 4U correspond to specific examples of "a top magnetic layer" in the invention.

Figure 26:
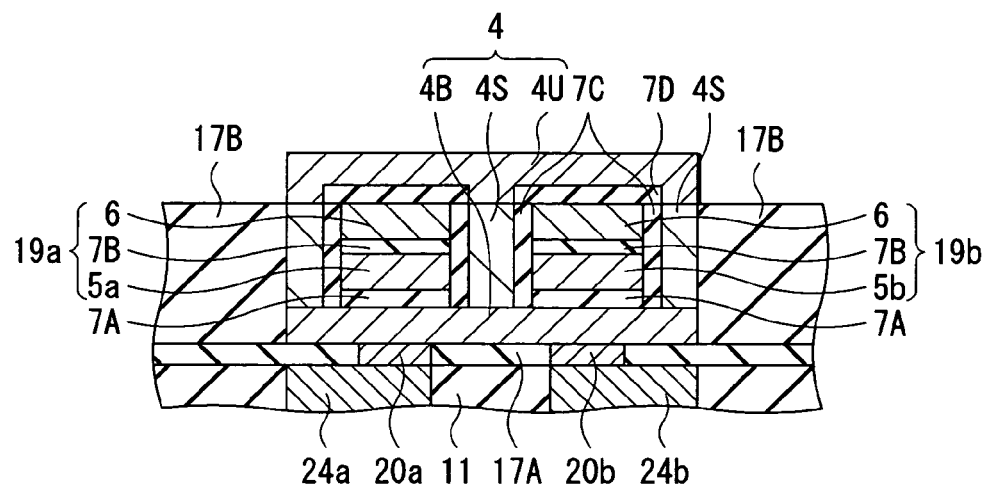
FIG. 26 is an enlarged sectional view showing a step following the step of FIG. 25.
Figure 27:
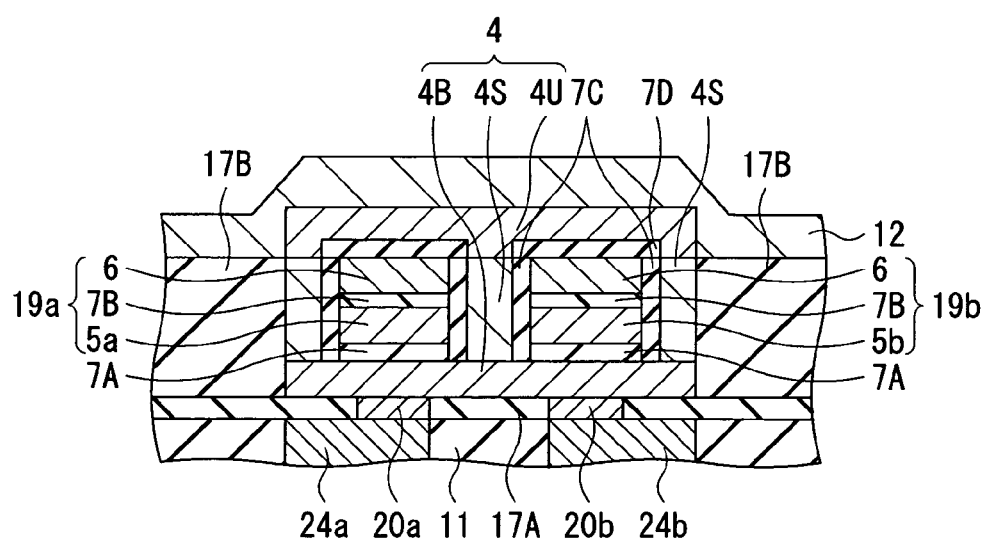
FIG. 27 is an enlarged sectional view showing a step following the step of FIG. 26.
Figure 28:
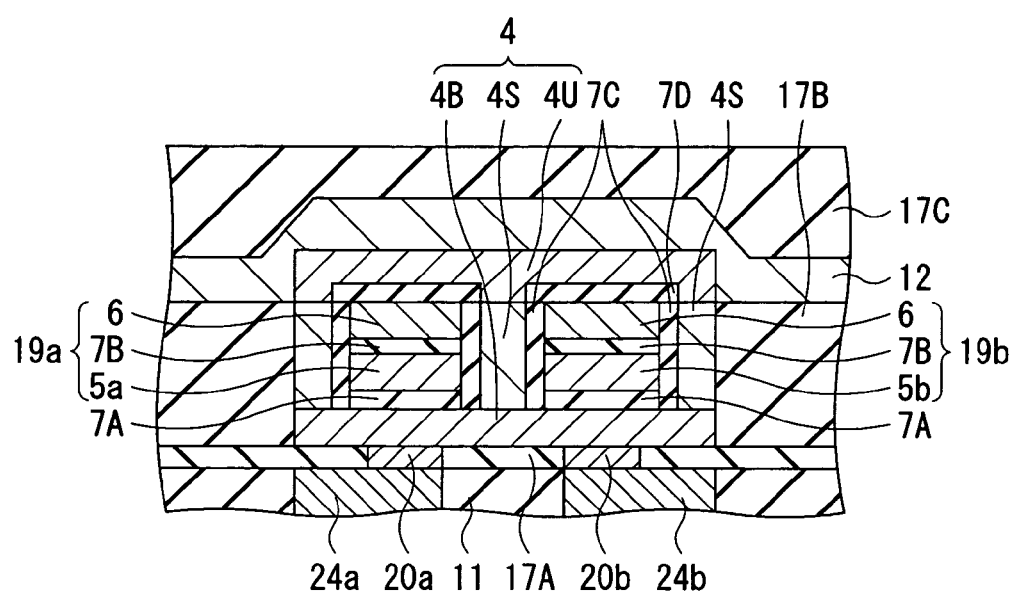
FIG. 28 is an enlarged sectional view showing a step following the step of FIG. 27.

Next, as shown in FIG. 26, the photoresist layer 31B is removed so as to expose the top magnetic layer 4U. Then, as shown in FIG. 27, the read word line 12 made of, for example, copper is formed by a plating process using the metal layer on the insulating layer 17B as an electrode film. Further, as shown in FIG. 28, after the insulating layer 17C made of $SiO_2$ or the like is formed on the whole surface by the CVD apparatus or the like, the surface of the insulating layer 17C is polished by the CMP apparatus or the like to planarize the surface.

After that, the write word line extraction electrode 41 is formed on each of both terminals of the write word line 6, and the write bit line extraction electrode 42 is formed on each of both terminals of the write bit line 5. Further, the read word line extraction electrode 43 is formed on each of both terminals of the read word line 12, and the read bit line extraction electrode 44 is formed on each of both terminals of the read bit line 13.

Thus, the formation of the storage cell group 54 including the storage cell 1 is completed tentatively.

After that, the manufacturing of the magnetic memory device is completed through a step of forming a protective layer made of $SiO_2$, $Al_2O_3$ or the like by a sputtering apparatus, a CVD apparatus or the like and a step of exposing each of the extraction electrodes 41 through 44 through polishing the protective film.

In the manufacturing method according to the embodiment, after the laminate portions 20a and 20b are formed on the substrate 11 in which the diodes 75a and 75b are buried, a pair of toroidal magnetic layers 4 which share a part between them are formed on the laminate portions 20a and 20b, so a structure in which the diodes 75a and 75b, the laminate portions 20a and 20b and the toroidal magnetic layers 4 are stacked in order can be obtained, and as a result, the magnetic memory device corresponding to the circuit structure shown in FIG. 8 can be obtained. In other words, the diodes 75a and 75b can be formed between a pair of read bit lines 13a and 13b and a pair of TMR films S20a and S20b. Therefore, after read currents from the sense amplifier circuit 56B pass through the TMR films S20a and S20b via the diodes 75a and 75b, the write currents can meet in the toroidal magnetic layer 4 as an integral type to go into the read word lines 6, and the magnetic memory device capable of preventing unnecessary sneak to a path except for the normal current path can be obtained.

Moreover, as a method for corresponding to the circuit structure shown in FIG. 8, a method of forming a magnetic memory device through stacking the toroidal magnetic layer, the TMR film and the diode (rectifying device) in order can be considered; however, in this case, the TMR film is broken due to heat during the formation of the diode (rectifying device), thereby the TMR film loses its function. Therefore, it is difficult to actually form the magnetic memory device by the method.

In addition, in the manufacturing method according to the embodiment, the laminate patterns 19 are formed through the use of the write word lines 6 as masks in a self-aligning way, so processing with high precision can be performed, and the step of forming the resist pattern, the step of removing the resist pattern and the like can be omitted, thereby the whole manufacturing steps can be simplified.

Second Embodiment

Next, referring to FIGS. 29A through 29C, a magnetic memory device according to a second embodiment of the invention will be described below.

Figure 29A:
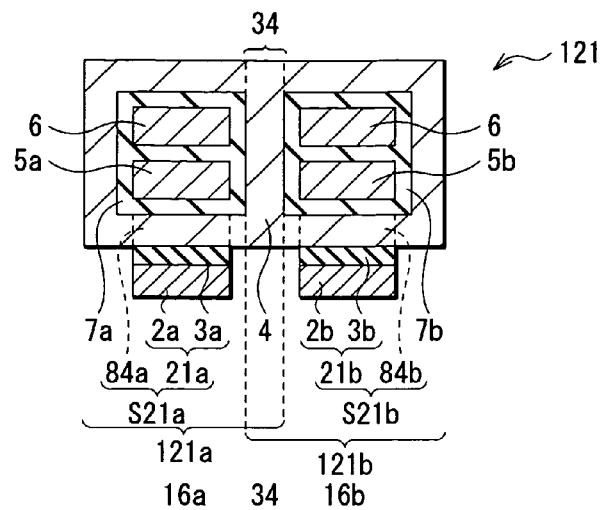
FIGS. 29A through 29C are sectional views showing a main part of a magnetic memory device according to a second embodiment of the invention.

FIG. 29A shows a sectional view of a storage cell 121 in the magnetic memory device according to the invention, and corresponds to FIG. 5A. In FIG. 29A, like components are denoted by like numerals as of FIG. 5A.

Only points of the structure of the magnetic memory device according to the embodiment, and its manufacturing method which are different from those in the first embodiment will be described below.

In the storage cell 1 in the magnetic memory device according to the above-described first embodiment, a magnetic sensitive layer includes the connecting portions 14a and 14b which are magnetically exchange coupled to each other, and the second magnetic layers 8a and 8b, and the connecting portions 14a and 14b constitute parts of the toroidal magnetic layer 4. On the other hand, a storage cell 121 in the magnetic memory device according to the embodiment has a structure in which a magnetic sensitive layer constitutes a part of the toroidal magnetic layer 4 as shown in FIG. 29A.

More specifically, connecting portions 84a and 84b are magnetic sensitive portions in the toroidal magnetic layer 4, and function as magnetic sensitive portions in TMR films S21a and S21b, thereby the second magnetic layer 8 can be removed, and the storage cell 121 with a simpler structure than that of the storage cell 1 can be formed. Herein, the connecting portions 84a and 84b correspond to specific examples of "a magnetic sensitive layer" in the invention, and the TMR films S21a and S21b correspond to specific examples of "a laminate" in the invention.

In this case, the magnetization easy axes of the first magnetic layers 2a and 2b and the connecting portions 84a and 84b are preferably parallel to each other. It is because in the state where the magnetization directions of the first magnetic layers 2a and 2b and the magnetization direction of the connecting portions 84a and 84b are parallel or antiparallel to each other, they can be stabilized. The toroidal magnetic layer 4 is made of, for example, a nickel-iron alloy (NiFe), and has a thickness of, for example, 20 nm in a sectional direction in the connecting portions 84a and 84b. It is preferable that the coercivities of the connecting portions 84a and 84b are within a range from $(50/4\pi) \times 10^3$ A/m to $(100/4\pi) \times 10^3$ A/m inclusive, and is smaller than the coercivity of the first magnetic layer 2. When the coercivities are less than $(50/4\pi) \times 10^3$ A/m, the magnetization directions of the connecting portions 84a and 84b may be disturbed by an undesirable magnetic field such as an external disturbance magnetic field. On the other hand, when the coercivities are larger than $(100/4\pi) \times 10^3$ A/m, the TMR device 20 may be degraded due to heat caused by an increase in a write current. Moreover, when the coercivities of the connecting portions 84a and 84b are equal to or higher than the coercivities of the first magnetic layers 2a and 2b, the write current increases to change the magnetization directions of the first magnetic layers 2a and 2b as the magnetization fixed layer, thereby the TMR devices 121a and 121b as storage devices are broken.

Moreover, in the storage cell 121, the connecting portions 84a and 84b function as storage layers which store information. In other words, the magnetization directions of the connecting portions 84a and 84b are reversed by a circulating magnetic field generated by the write currents flowing through the write bit lines 5 and the write word lines 6, thereby information is stored. Referring to FIGS. 29B and 29C, the write operation in the storage cell 121 will be described in detail below. FIGS. 29B and 29C show a relationship between the direction of a write current and the direction of a circulating magnetic field (magnetization direction) in a sectional structure of the storage cell 121.

Figure 29B:
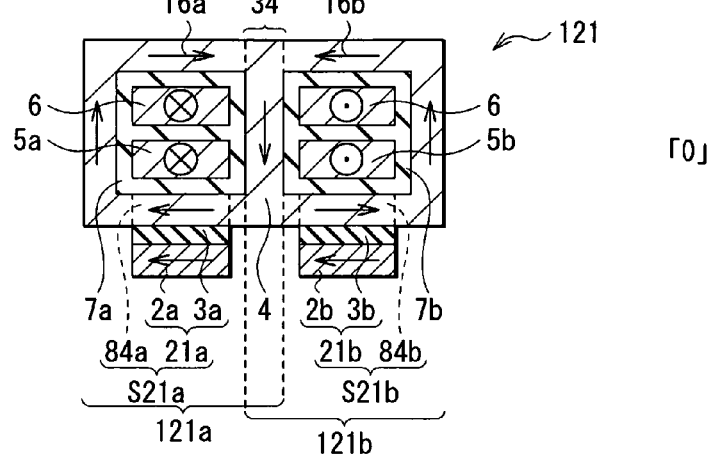
Figure 29C:
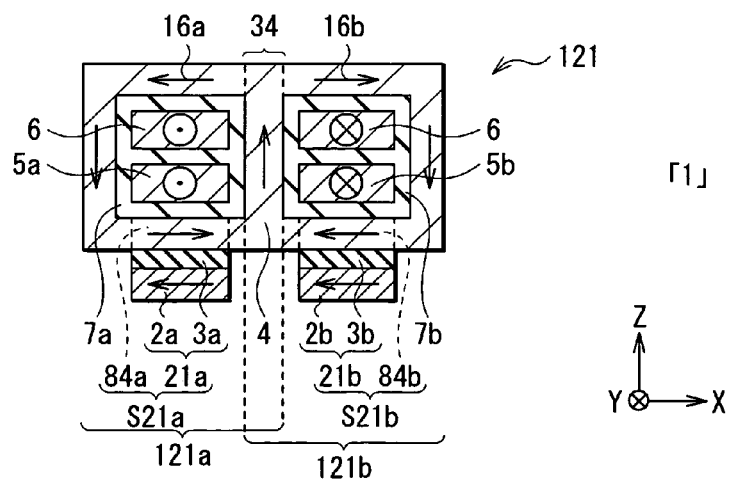

FIGS. 29B and 29C show the case where write currents flow in the same direction through the write bit line 5 and the write word line 6 which penetrate through the TMR devices 121a and 121b and are parallel to each other. FIG. 29B shows the case where a write current flows through the TMR device 121a in a direction perpendicular to a paper plane from the front to the back (to a +Y direction), thereby a circulating magnetic field 16a is generated in a clockwise direction in a part of the toroidal magnetic layer 4 with which the write bit line 6a is surrounded, and a write current flows in the TMR device 121b in a direction perpendicular to the paper plane from the back to the front (to a −Y direction), thereby a circulating magnetic field 16b is generated in a counterclockwise direction in a part of the toroidal magnetic layer 4 with which the write bit line 5b is surrounded. In this case, the magnetization direction of the connecting portion 84a is turned to a −X direction, and the magnetization direction of the connecting portion 84b is turned to a +X direction. On the other hand, FIG. 29C corresponds to the case where the directions of currents flowing through the write bit lines 5 and the write word lines 6 are completely opposite to those in the case shown in FIG. 29B. More specifically, FIG. 29C shows the case where a write current flows through the TMR device 121a in a direction perpendicular to the paper plane from the back to the front (to a −Y direction), thereby the circulating magnetic field 16a is generated in a counterclockwise direction in a part of the toroidal magnetic layer 4 with which the write bit line 5a is surrounded, and a write current flows through the TMR device 121b in a direction perpendicular to the paper plane from the front to the back (to a +Y direction), thereby the circulating magnetic field 16b is generated in a clockwise direction in a part of the toroidal magnetic layer 4 with which the write bit line 5b is surrounded. In this case, the magnetization direction of the connecting portion 84a is turned to a +X direction, and the magnetization direction of the connecting portion 84b is turned to a −X direction.

Thus, when the currents flow through the write bit lines 5 and the write word lines 6 in the same direction, the magnetization directions of the connecting portions 84a and 84b are reversed, thereby binary information 0 or 1 is stored. For example, when the state shown in FIG. 29B is 0, the state shown in FIG. 29C is identified as 1. In this case, when the write currents flow in opposite directions, or when a write current flows only through either the write bit lines 5 or the write word lines 6, the magnetization directions of the connecting portions 84a and 84b are not reversed, thereby data is not rewritten.

As described above, in the magnetic memory device according to the embodiment, the connecting portions 84a and 84b are magnetic sensitive portions in the toroidal magnetic layer 4, and also function as magnetic sensitive portions in the TMR films S21a and S21b. Therefore, the second magnetic layer 8 can be removed, and the storage cell 121 with a simpler structure can be formed.

Third Embodiment

Next, referring to FIGS. 30A through 30C, a magnetic memory device according to a third embodiment of the invention will be described below.

Figure 30A:
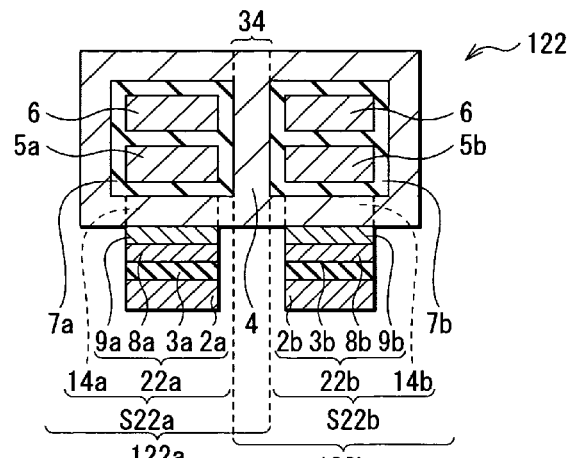
FIGS. 30A through 30C are sectional views showing a main part of a magnetic memory device according to a third embodiment of the invention.

FIG. 30A shows a sectional view of a storage cell 122 in the magnetic memory device according to the embodiment, and corresponds to FIGS. 5A and 29A. In FIG. 30A, like components are denoted by like numerals as of FIGS. 5A and 29A.

Only points regarding the structure of the magnetic memory device according to the embodiment, and its manufacturing method which are different from those in the first embodiment and the second embodiment will be described below.

In the storage cell 1 in the magnetic memory device according to the above-described first embodiment, the magnetic sensitive layer includes the connecting portions 14a and 14b which constitutes parts of the toroidal magnetic layer 4, and the second magnetic layers 8a and 8b, and the connecting portions 14a and 14b and the second magnetic layers 8a and 8b are magnetically exchange coupled to each other.

On the other hand, as shown in FIG. 30A, a storage cell 122 in the magnetic memory device according to the embodiment further includes non-magnetic conductive layers 9a and 9b for making the connecting portions 14a and 14b and the second magnetic layers 8a and 8b antiferromagnetically coupled to each other between the connecting portions 14a and 14b and the second magnetic layers 8a and 8b in addition to the structure of the storage cell 1. More specifically, the storage cell 122 includes a pair of TMR devices 122a and 122b, and the TMR device 122a includes a TMR film S22a and the TMR device 122b includes a TMR film S22b. A pair of TMR films S22a and S22b include laminate portions 22a and 22b and the connecting portions 14a and 14b, and the laminate portions 22a and 22b include non-magnetic conductive layers 9a and 9b, the second magnetic layer 8a and 8b, the tunnel barrier layers 3a and 3b and the first magnetic layers 2a and 2b in order from a side closer to the toroidal magnetic layer 4. The non-magnetic conductive layers 9a and 9b are made of, for example, ruthenium (Ru), copper (Cu) or the like. Herein, the non-magnetic conductive layers 9a and 9b correspond to specific examples of "a first non-magnetic conductive layer" in the invention.

In the magnetic memory device according to the embodiment, the connecting portions 14a and 14b and the second magnetic layers 8a and 8b are antiferromagnetically coupled to each other, so even if the coercivities of the connecting portions 14a and 14b are less than $(50/4\pi) \times 10^3$ A/m, a problem that the magnetization directions of the connecting portions 14a and 14b are disturbed by an undesirable magnetic field such as an external disturbance magnetic field will not occur, and the toroidal magnetic layer 4 can be made of, for example, iron (Fe), NiFe, CoFe, NiFeCo, cobalt (Co) or the like.

The second magnetic layers 8a and 8b are portions where information is stored, and are stabilized by an anisotropic magnetic field by antiferromagnetic coupling. It is preferable that the coercivities of the second magnetic layers 8a and 8b are within a range of $(100/4\pi) \times 10^3$ A/m or less, and are smaller than the coercivities of the first magnetic layers 2a and 2b.

Next, referring to FIGS. 30B and 30C, the write operation in the storage cell 122 will be described below. FIGS. 30B and 30C show a relationship between the direction of a write current and the direction of a circulating magnetic field (magnetization direction) in a sectional view of the storage cell 122 shown in FIG. 30A.

Figure 30B:
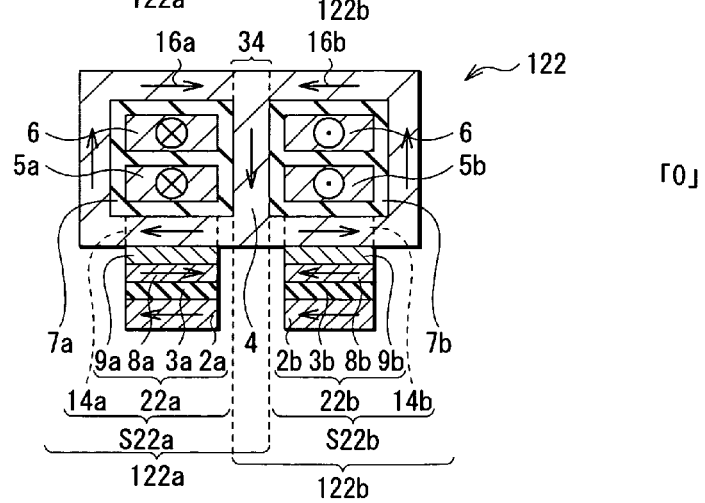
Figure 30C:
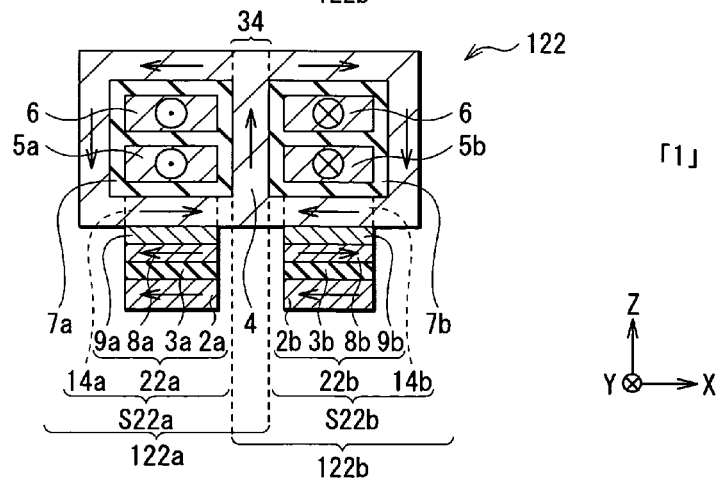

FIGS. 30B and 30C show the case where write currents flow through the write bit lines 5 and the write word lines 6 which penetrate through the storage cell 122 and are parallel to each other in the same direction. FIG. 30B shows the case where a write current flows through the TMR device 122a in a direction perpendicular to a paper plane from the front to the back (to a +Y direction), thereby a circulating magnetic field 16a is generated in a clockwise direction in a part of the toroidal magnetic layer 4 with which the write bit line 5a is surrounded, and a write current flows in the TMR device 122b in a direction perpendicular to the paper plane from the back to the front (to a –Y direction), thereby a circulating magnetic field 16b is generated in a counterclockwise direction in a part of the toroidal magnetic layer 4 with which the write bit line 5b is surrounded. In this case, the magnetization direction of the second magnetic layer 8a is turned to a +X direction, and the magnetization direction of the second magnetic layer 8b is turned to a –X direction. On the other hand, FIG. 30C corresponds to the case where the directions of currents flowing through the write bit lines 5 and the write word lines 6 are completely opposite to those in the case shown in FIG. 30B. More specifically, FIG. 30C shows the case where a write current flows through the TMR device 122a in a direction perpendicular to the paper plane from the back to the front (to a –Y direction), thereby the circulating magnetic field 16a is generated in a counterclockwise direction in a part of the toroidal magnetic layer 4 with which the write bit line 5a is surrounded, and a write current flows through the TMR device 122b in a direction perpendicular to the paper plane from the front to the back (to a +Y direction), thereby the circulating magnetic field 16b is generated in a clockwise direction in a part of the toroidal magnetic layer 4 with which the write bit line 5b is surrounded. In this case, the magnetization direction of second magnetic layer 8a is turned to a –X direction, and the magnetization direction of the second magnetic layer 8b is turned to a +X direction.

Thus, when the currents flow through the write bit lines 5 and the write word lines 6 in the same direction, the magnetization directions of the second magnetic layers 8 are reversed, thereby binary information 0 or 1 is stored. For example, when the state shown in FIG. 30B is 0, the state shown in FIG. 30C is identified as 1. In this case, when the write currents flow in opposite directions, or when a write current flows only through either the write bit line 5 or the write word line 6, the magnetization directions of the second magnetic layers 8 are not reversed, thereby data is not rewritten.

As described above, in the magnetic memory device according to the embodiment, in addition to the structure according to the first embodiment, the non-magnetic conductive layers 9a and 9b are further included between the connection portions 14a and 14b of the toroidal magnetic layer 4 and the second magnetic layers 8a and 8b. Thereby, strong antiferromagnetic coupling between the connecting portions 14a and 14b and the second magnetic layers 8a and 8b can be formed, so the magnetization directions of the connecting portions 14a and 14b and the second magnetic layers 8a and 8b as the magnetic sensitive layers are stabilized without being disturbed by an undesirable magnetic field such as an external disturbance magnetic field. In addition to this, the coercivities of the connecting portions 14a and 14b can be reduced by the above structure. Therefore, a heating value can be reduced through reducing a current value during the write operation, and when the non-magnetic conductive layers 9a and 9b are disposed, a metal element or the like included in the connecting portions 14a and 14b can be prevented from being diffused and moved into the second magnetic layers 8a and 8b, so thermal stability can be improved. As a result, more stable writing can be performed.

<Modifications>

Next, referring to FIGS. 31A through 31C, modifications in the embodiment will be described below. FIGS. 31A through 31C show sectional views of TMR devices including a pair of TMR films as a modification of a pair of TMR films S22a and S22b shown in FIGS. 30A through 30C. However, only one of the TMR devices is shown because of space limitation.

<<First Modification>>

The TMR films S22a and S22b included in the TMR devices 122a and 122b according to the embodiment has a structure called a coercivity difference type in which the first magnetic layer 2 having a larger coercivity than the second magnetic layer 8 is included. On the other hand, a TMR film S221 (S221a) as a first modification shown in FIG. 31A has a structure called a exchange bias type in which the magnetization direction of the first magnetic layer 2 is fixed by exchange coupling.

More specifically, the TMR film S221a includes the connecting portion 14a and a laminate portion 221a, and the laminate portion 221a includes the second magnetic layer 8a, the tunnel barrier layer 3a, the first magnetic layer 2a and a third magnetic layer 15a in order from a side closer to the toroidal magnetic layer 4. The third magnetic layer 15a has antiferromagnetism, and has a function of fixing the magnetization direction of the first magnetic layer 2a by exchange intersection with the first magnetic layer 2a, and the third magnetic layer 15a is made of, for example, an antiferromagnetic material such as a platinum-manganese alloy (PtMn), an iridium-manganese alloy (IrMn), iron-manganese (FeMn), nickel-manganese (NiMn) or ruthenium-manganese (RuMn).

In the case of the TMR film S221a with the exchange bias type structure shown in FIG. 31A, the magnetization direction of the first magnetic layer 2 can be stably fixed by the third magnetic layer 15, so the coercivity of the first magnetic layer 2 can be less than $(50/4\pi) \times 10^3$ A/m.

<<Second Modification>>

A TMR film S222 (S222a) as a second modification shown in FIG. 31B further includes a fourth magnetic layer 18a between the first magnetic layer 2a and the tunnel barrier layer 3a in addition to the structure of the TMR film S221 (S221a) shown in FIG. 31A.

More specifically, the TMR film S222 (S222a) includes the connecting portion 14a and a laminate portion 222a, and the laminate portion 222a includes the second magnetic layer 8a, the tunnel barrier layer 3a, the fourth magnetic layer 18a, the first magnetic layer 2a and the third magnetic layer 15a in order from a side closer to the toroidal magnetic layer 4. The fourth magnetic layer 18a forms exchange coupling to the first magnetic layer 2a, and the first magnetic layer 2a forms antiferromagnetic coupling to the third magnetic layer 15a. The fourth magnetic layer 18a is made of, for example, iron (Fe), NiFe, CoFe, NiFeCo, cobalt (Co) or the like.

The modification has the above-described structure, so the magnetization direction of the first magnetic layer 2a can be stably fixed by the antiferromagnetic third magnetic layer 15a, so the coercivity of the first magnetic layer 2a can be less than $(50/4\pi) \times 10^3$ A/m. Moreover, a material with high polarizability can be applied to the fourth magnetic layer 18a, so the MR ratio of the TMR film S222 (S222a) can be increased.

<<Third Modification>>

A TMR film S223 (S223a) as a third modification shown in FIG. 31C further includes a non-magnetic conductive layer 35a between the fourth magnetic layer 18a an the first magnetic layer 2a. Herein, the non-magnetic conductive layer 35a corresponds to a specific example of "a second non-magnetic conductive layer" in the invention.

More specifically, the TMR film S223 (S223a) includes the connecting portion 14a and a laminate portion 223a, and the laminate portion 223a includes the second magnetic layer 8a, the tunnel barrier layer 3a, the fourth magnetic layer 18a, the non-magnetic conductive layer 35a, the first magnetic layer 2a and the third magnetic layer 15a in order from a side closer to the toroidal magnetic layer 4.

In the modification, antiferromagnetic coupling between the fourth magnetic layer 18a and the first magnetic layer 2a is formed by the above-described structure, and their static magnetic fields form a closed magnetic path, so the magnetization direction of the first magnetic layer 2a as a magnetization fixed layer can be more stabilized, and the sneak of the magnetic field to the second magnetic layer 8a can be prevented. Therefore, a write current in the case where the magnetization direction of the second magnetic layer 8a as the magnetic sensitive layer is reversed can be reduced.

Moreover, a specific example of the embodiment will be described below.

In the embodiment, on the basis of the manufacturing method described in the above-described first embodiment, a sample of the following magnetic memory device was formed. More specifically, a magnetic memory device in which a plurality of storage cells 1 each including a pair of TMR devices 1a and 1b with a sectional structure shown in FIG. 5A were disposed in a matrix form was formed as Sample 1.

The MR ratio, the TMR device resistance, the switching current, and the adjacent cell reversing current in the magnetic memory device of Sample 1 were measured. The measurement values of the MR ratio and the TMR device resistance were average values of the pair of TMR devices in the storage cell. The switching current and the adjacent cell reversing current were measured through flowing write currents with the same magnitude into a pair of write bit lines 5a and 5b and the write word lines 6 at the same time. The results are shown in Table 1. Example 1 in Table 1 corresponds to Sample 1. For the comparison, the same measurement was carried out on a storage cell 201 including a pair of TMR devices 201a and 201b which included toroidal magnetic layers 204a and 204b which did not share a part and were magnetically independent of each other shown in FIG. 37A, and the results are shown in Table 1 as Comparative Example 1. Moreover, the same measurement was carried out on a magnetic memory device including a storage cell with a structure including no toroidal magnetic layer shown in FIG. 37B, and the results are shown in Table 1 as Comparative Example 2. In addition, an applied magnetic field at the time of the measurement was $(500/4\pi) \times 10^3$ A/m. The storage cell 301 as Comparative Example 2 shown in FIG. 37B included a pair of write bit line 5a and 5b and the write word lines 6 which were buried in the insulating films 7a and 7b and extended in parallel to each other, and a pair of TMR films 320a and 320b disposed at the bottom of the write bit lines 5a and 5b and the write word lines 6 with non-magnetic layers 317a and 317b in between, and the storage cell 301 included no toroidal magnetic layer with which the pair of write bit lines 5a and 5b and the write word lines 6 were surrounded.

As shown in Table 1, there was not much difference in the MR ratio and the TMR device resistance between Example 1 and Comparative Examples 1 and 2; however, a significant difference in the switching current and the adjacent cell reversing current could be confirmed.

The switching current is a minimum current value which is necessary to reverse the magnetization direction in a storage cell targeted for writing. As a result, Example 1 had a lower switching current than Comparative Examples 1 and 2. The result showed that as the magnetization of the magnetic sensitive layer could be efficiently reversed, the write operation could be performed with a small current. In other words, it was confirmed that as adjacent TMR devices shared a part of the toroidal magnetic layer between them, a large circulating magnetic field could be formed even by a small current.

The adjacent cell reversing current shows a current value at which the magnetization direction of a storage cell where the write operation is not supposed to be performed is reversed by a current applied to a storage cell targeted for writing and a storage cell adjacent to the storage cell. As shown in Table 1, it was confirmed that in Example 1, even if a larger write current than that in Comparative Example 2 was applied, the magnetization direction of the adjacent storage cell was not reversed. It showed that a closed magnetic path was formed, and the occurrence of a magnetic field which had an adverse influence on the adjacent storage cell could be prevented.

Although the invention is described referring to some embodiments and some modifications, the invention is not specifically limited to them, and can be variously modified. For example, in the embodiments and the modifications, the Schottky diode 75 is used as a rectifying device for backflow prevention; however, instead of the Schottky diode 75, a bipolar transistor which is a device having the same rectifying function can be used.

Figure 33:
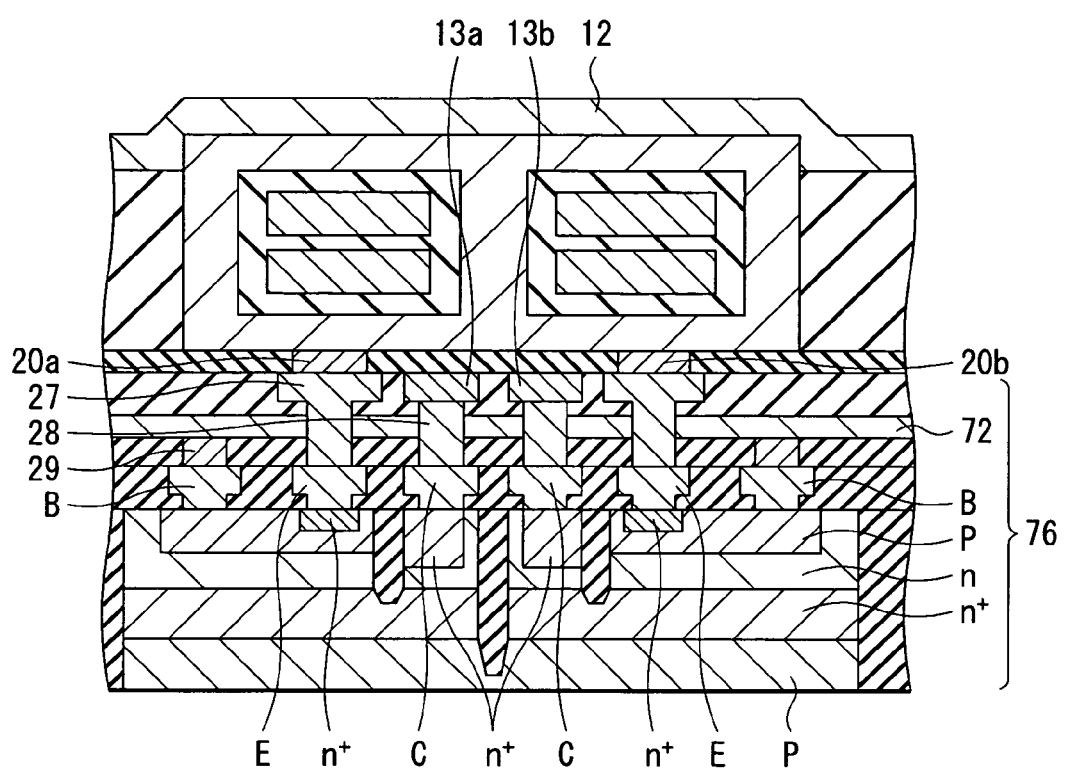
FIG. 33 is a partially sectional view of a modification of the rectifying device shown in FIG. 32.

FIG. 32 shows the structure of a main part of a circuit in the case where bipolar transistors 76a and 76b are disposed between the read bit lines 13a and 13b and the TMR films S20a and S20b. FIG. 33 shows a sectional view of the bipolar transistors 76a and 76b. The bases B of the bipolar transistors 76a and 76b are connected to the word decode line 72. The collectors C of the bipolar transistors 76a and 76b are connected to the read bit lines 13a and 13b via connecting layers 28, respectively, and the emitters E are connected to the TMR films S20a and S20b via connecting layers 27, respectively.

Figure 34:
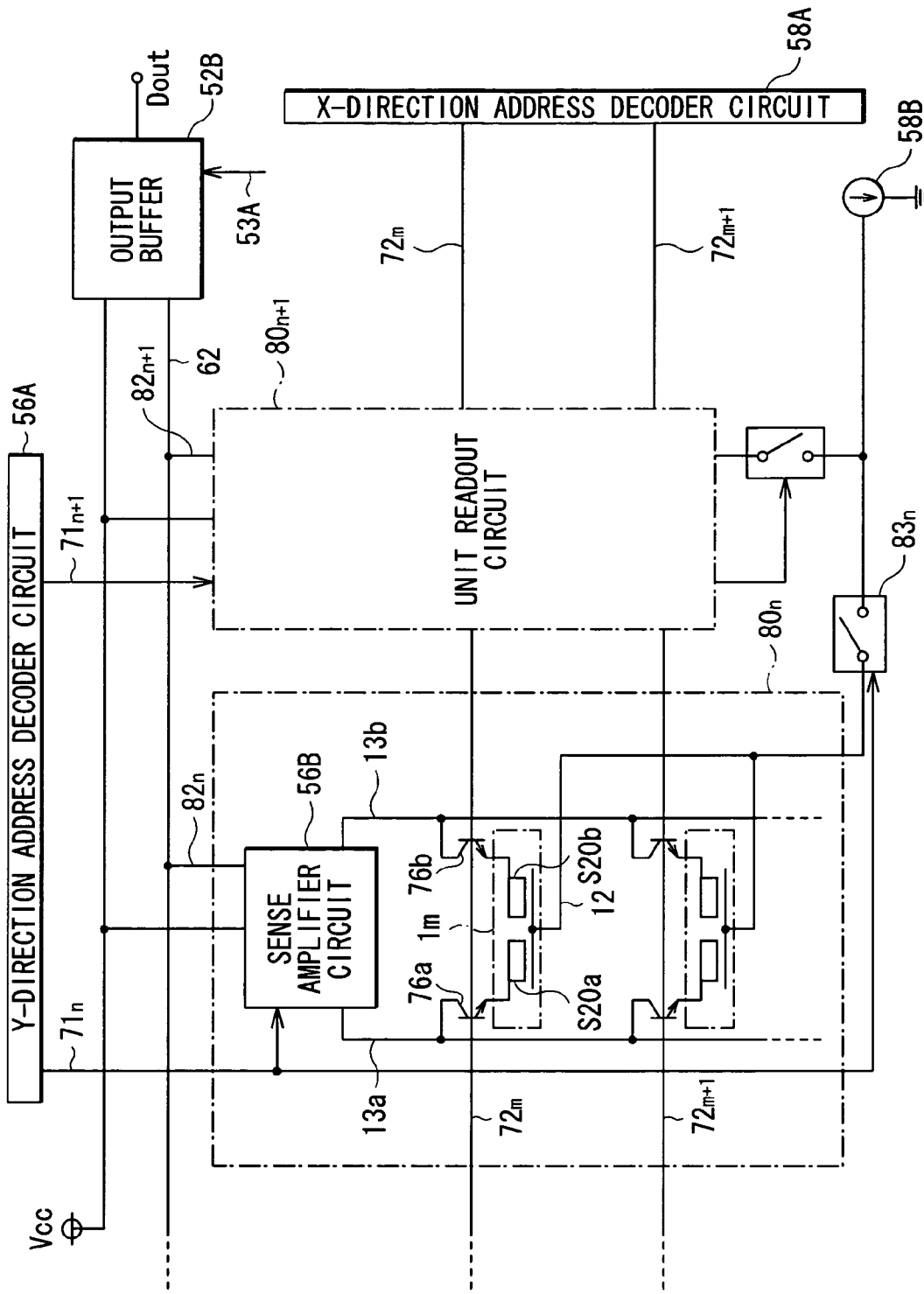
FIG. 34 is a circuit diagram showing the whole circuit structure of the modification of the rectifying device shown in FIG. 32.

FIG. 34 shows the whole readout circuit in the case where the bipolar transistors 76a and 76b are disposed. In this case, when a control signal from the Y-direction address decoder circuit 56A is transmitted to, for example, the sense amplifier circuit 56B of the unit readout circuit 80n, the sense amplifier circuit 56B emits a read current so as to feed the read current through the read bit lines 13a and 13b. The control signal from the Y-direction address decoder circuit 56A is transmitted to the readout switch 83n at the same time, and the readout switch 83n is brought into conduction. On the other hand, the X-direction address decoder circuit 58A selects a storage cell 1m, and emits a control signal so as to feed the control signal through a word decode line 72m. When the control signal from the X-direction address decoder circuit 58A is transmitted to the bases B of the bipolar transistors 76a and 76b, paths between the collectors C and the emitter E are brought into conduction. As a result, a read current passes through each of the TMR films S20a and S20b of the storage cell 1m, and finally flows into the constant current circuit 58B via the readout switch 83n. As in the case of the diode 75, the bipolar transistor 76 has a function of allowing a current to flow in one direction, so the sneak of the read current shown in FIG. 38 can be prevented.

Figure 35:
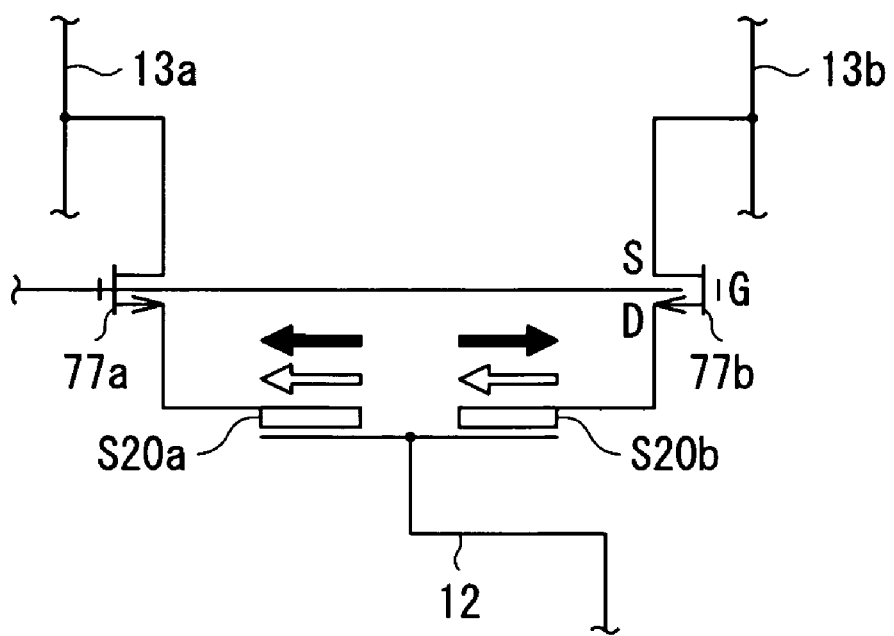
FIG. 35 is a partially enlarged view showing another modification of the rectifying device in the circuit structure shown in FIG. 8.
Figure 36:
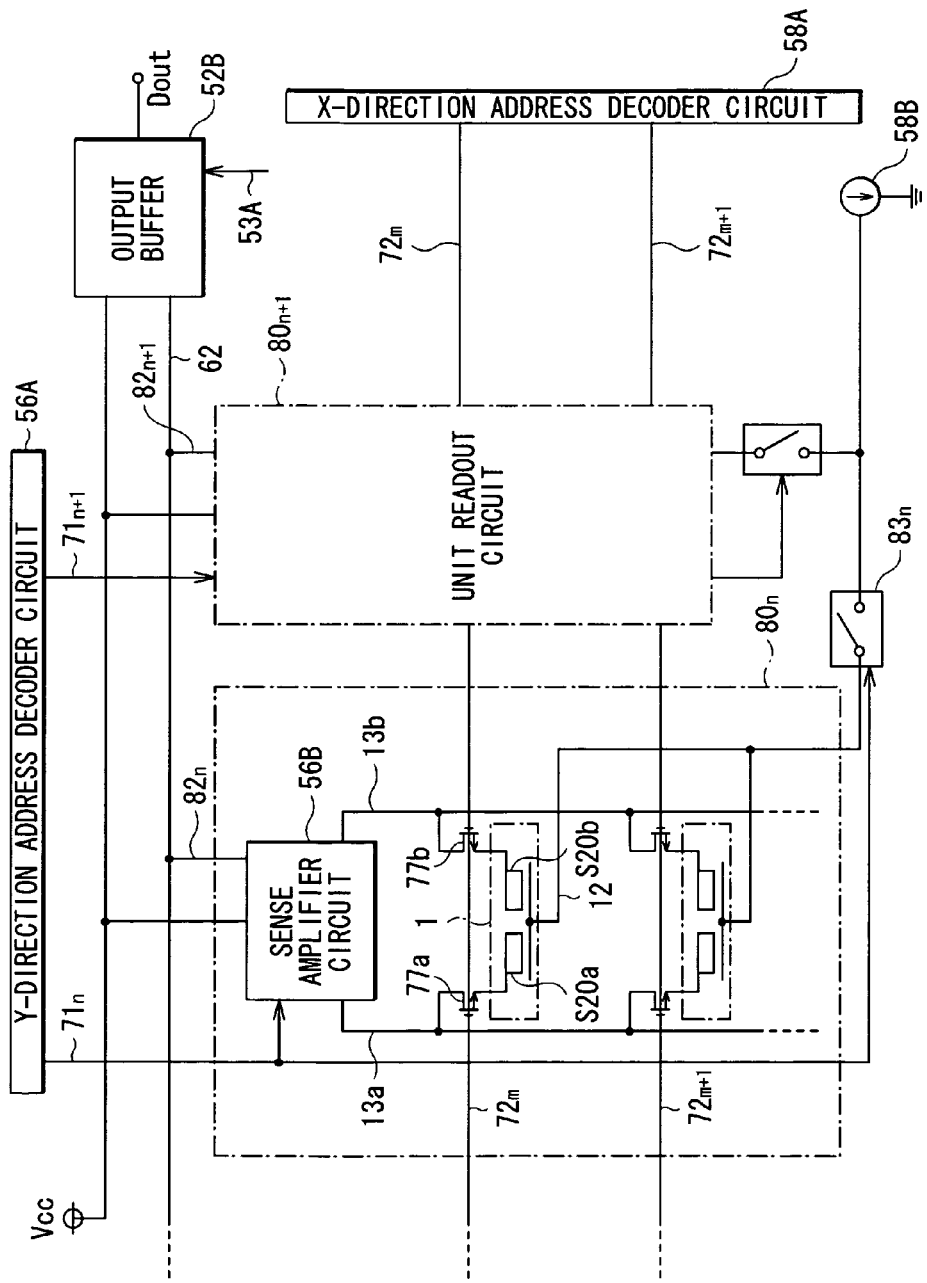
FIG. 36 is a circuit diagram showing the whole circuit structure of another modification of the rectifying device shown in FIG. 35.

Moreover, as a rectifying device for backflow prevention, as shown in FIG. 35, MOS transistors 77a and 77b can be used. In this case, the sources S of the MOS transistors 77a and 77b are connected to the read bit lines 13a and 13b, respectively, and the drains D are connected to the TMR films S20a and S20b, respectively, and when the gates G connected to the word decode line 72 is closed, the MOS transistors 77a and 77b can be brought into conduction. FIG. 36 shows the whole readout circuit in the case where the MOS transistors 77a and 77b are disposed. The read operation in the readout circuit shown in FIG. 36 is the same as the circuit using the above-described bipolar transistors 76.

Moreover, in the embodiments, the case where the parallel portion 10 where the write bit lines 5 and the write word lines 6 are parallel to each other is included is described; however, the invention is not specifically limited to the case, and for example, the invention may be applied to the case where the write bit lines 5 and the write word lines 6 form an angle of, for example, 90°. However, the case where the toroidal magnetic layer 4 is formed so that the parallel portion 10 is surrounded with the toroidal magnetic layer 4 is more preferable, because the magnetization of the magnetic sensitive layer is reversed more efficiently.

As described above, in the magnetic storage cell or the magnetic memory device according to the invention, a pair of magneto-resistive devices each include a laminate which includes the magnetic sensitive layer of which the magnetization direction is changed by an external magnetic field and through which a current flows in a direction perpendicular to a laminate surface, and a toroidal magnetic layer which is disposed on one surface of the laminate so that a direction along the laminate surface is an axial direction, and a plurality of leads (first and the second write lines) penetrate through the toroidal magnetic layer, and the pair of magneto-resistive devices share a part of the toroidal magnetic layer between them, so compared to the case where a part of the toroidal magnetic layer is not shared, and the toroidal magnetic layer is disposed separately, a decline in the magnitude of a circulating magnetic field in a closed magnetic path can be prevented, and the magnetization of the magnetic sensitive layer can be reversed by a smaller write current.

In particular, in the magnetic memory device according to the invention including a plurality of magnetic storage cells, a magnetic influence on a storage cell adjacent to a storage cell targeted for writing can be reduced.

In particular, in the magnetic storage cell and the magnetic memory device according to the invention, when a plurality of write lines extend in parallel to each other in a region where the plurality of write lines penetrate through the toroidal magnetic layer, a combined magnetic field generated in the magnetic sensitive layer through flowing currents through a plurality of leads can be increased, compared to the case where the leads intersect each other, and the magnetization of the toroidal magnetic layer can be reversed more efficiently. As a result, a write current which is necessary to reverse the magnetization can be reduced. Moreover, the magnetization directions of a plurality of magnetic domains in the magnetic sensitive layer can be aligned more favorably, so higher reliability can be obtained.

Moreover, in the magnetic storage cell and the magnetic memory device according to the invention, a pair of rectifying devices disposed between a pair of first read lines and a pair of magneto-resistive devices, and the second read line which lead read currents flowing through a pair of rectifying devices to the ground on current paths of read currents supplied to a pair of magneto-resistive devices are included, and a laminate and the toroidal magnetic layer are disposed in order on a substrate on which the rectifying devices are disposed, so fluctuations due to the sneak of the read current, that is, noises in the read signal can be reduced, and magnetic information can be stably read out.

The magnetic memory device manufacturing method according to the invention includes a step of forming a pair of laminate portions which are parts of a pair of laminates on the substrate on which a pair of rectifying devices are formed so as to correspond to the pair of rectifying devices; a step of forming the bottom magnetic layer so that at least the pair of laminates are covered with the bottom magnetic layer; a step of forming a pair of first write lines on the bottom magnetic layer with the first insulating film in between; a step of forming a pair of second write lines on the pair of first write lines with the second insulating film in between so as to include a portion where the first write lines and the second write lines extend in parallel to each other; a laminate pattern forming step of forming a pair of laminate patterns each including a portion where the first write lines and the second write lines extend in parallel to each other through etching and patterning the pair of the second write lines, the second insulating film and the pair of first write lines in order; and a step of forming a pair of toroidal magnetic layers which share a part between them through disposing a top magnetic layer so that the pair of laminate patterns are surrounded with the top magnetic layer with the third insulating film in between, thereby forming the memory storage cell including a pair of the magneto-resistive devices, so the structure in which a pair of magnetic storage cells shares a part of the toroidal magnetic layer between them can be obtained. Moreover, a current path in which after a pair of read currents flow through a pair of rectifying devices and a pair of laminates, the currents meet in the toroidal magnetic layer can be formed. Therefore, the sneak of the read current can be prevented, and magnetic information can be read out stably.

In particular, in the laminate pattern forming step, when the second insulating film and the pair of first write lines are selectively etched through the use of the pair of second write lines as masks so as to form a pair of laminate patterns in a self-aligning way, processing with high precision can be performed, and the manufacturing steps can be simplified.

TABLE 1

|  | MR RATIO % | TMR DEVICE RESIST-ANCE $\Omega \cdot (\mu m)^2$ | SWITCHING CURRENT mA | ADJACENT CELL REVERSING CURRENT mA |
|---|---|---|---|---|
| EXAMPLE 1 | 37 | 720 | 1.2 | 20.0 or more |
| COMPARATIVE EXAMPLE 1 | 39 | 698 | 2.3 | 20.0 or more |
| COMPARATIVE EXAMPLE 2 | 38 | 705 | 8.5 | 12.0 |

The invention claimed is:
1. A magnetic storage cell, comprising:
a pair of magneto-resistive devices each of which includes;
a laminate including a magnetic sensitive layer of which the magnetization direction is changed by an external magnetic field and allowing a current to flow therethrough in a direction perpendicular to a laminate surface;

a toroidal magnetic layer disposed on one surface of the laminate so that a direction along the laminate surface is an axial direction and a plurality of leads penetrate the toroidal magnetic layer;

wherein only a part of one of the pair of the toroidal magnetic layers in the pair of the magneto-resistive devices shares the physical space identical to a part of the other toroidal magnetic layer.

2. A magnetic storage cell according to claim 1, wherein the laminate is electrically connected to the toroidal magnetic layer.

3. A magnetic storage cell according to claim 1, wherein the plurality of leads extend in parallel to each other in a region where the plurality of leads penetrate through the toroidal magnetic layer.

4. A magnetic storage cell according to claim 1, wherein
the magnetization directions of the magnetic sensitive layers in the pair of magneto-resistive devices are changed by a magnetic field generated by currents flowing through the plurality of leads penetrating through the toroidal magnetic layer so as to be turned in antiparallel to each other, thereby information is stored in the pair of magneto-resistive devices.

5. A magnetic storage cell according to claim 4, wherein
either of a first state in which either of the pair of magnetic sensitive layers in the pair of magneto-resistive devices is magnetized in a first direction, and the other one is magnetized in a second direction antiparallel to the first direction, or a second state in which either of the pair of magnetic sensitive layers is magnetized in the second direction and the other one is magnetized in the first direction is selected, thereby information is stored in the pair of magneto-resistive devices corresponding to the first state and the second state.

6. A magnetic storage cell according to claim 1, wherein the pair of magnetic sensitive layers constitute parts of the toroidal magnetic layer.

7. A magnetic storage cell according to claim 1, wherein
the pair of magnetic sensitive layers each include a first magnetic sensitive portion and a second magnetic sensitive portion which are magnetically exchange coupled to each other, and the first magnetic sensitive portion constitutes a part of the toroidal magnetic layer.

8. A magnetic storage cell according to claim 7, wherein
a pair of first non-magnetic conductive layers for antiferromagnetically coupling between the pair of first magnetic sensitive portions and the pair of second magnetic sensitive portions are disposed between the pair of first magnetic sensitive portions and the pair of second magnetic sensitive portions.

9. A magnetic storage cell according to claim 7, wherein
the pair of second magnetic sensitive portions have a larger coercivity than the pair of first magnetic sensitive portions.

10. A magnetic storage cell according to claim 6, wherein
a pair of the laminates each include:
a non-magnetic layer;
a first magnetic layer stacked on one side of the non-magnetic layer and having a fixed magnetization direction; and
the magnetic sensitive layer stacked on a side of the non-magnetic layer opposite to the side where the first magnetic layer is disposed, wherein information is detected on the basis of currents flowing through the pair of laminates.

11. A magnetic storage cell according to claim 7, wherein
a pair of the laminates each include:
a non-magnetic layer;
a first magnetic layer stacked on one side of the non-magnetic layer and having a fixed magnetization direction; and
a second magnetic layer stacked on a side of the non-magnetic layer opposite to the side where the first magnetic layer is disposed and functioning as the second magnetic sensitive portion, wherein information is detected on the basis of currents flowing through the pair of laminates.

12. A magnetic storage cell according to claim 11, wherein
the first magnetic layer has a larger coercivity than the second magnetic layer.

13. A magnetic storage cell according to claim 11, wherein
an antiferromagnetic third magnetic layer which is exchange coupled to the first magnetic layer is disposed on a side of the first magnetic layer opposite to a side where the non-magnetic layer is disposed.

14. A magnetic storage cell according to claim 11, wherein
a fourth magnetic layer which is exchange coupled to the first magnetic layer is disposed between the first magnetic layer and the non-magnetic layer.

15. A magnetic storage cell according to claim 14, wherein
a second non-magnetic conductive layer for antiferromagnetically coupling between the first magnetic layer and the fourth magnetic layer is disposed between the first magnetic layer and the fourth magnetic layer.

16. A magnetic storage cell according to claim 10, wherein
the non-magnetic layer is made of an insulating layer which can generate a tunneling effect.

17. A magnetic memory device, comprising:
a first write line;
a second write line extending so as to intersect with the first write line; and
a magnetic storage cell including a pair of magneto-resistive devices, wherein the pair of magneto-resistive devices each include:
a laminate including a magnetic sensitive layer of which the magnetization direction is changed by an external magnetic field and allowing a current to flow therethrough in a direction perpendicular to a laminate surface;
a toroidal magnetic layer disposed on one surface of the laminate so that a direction along the laminate surface is an axial direction and the first write line and the second write line penetrate through the toroidal magnetic layer, and
only a part of one of the pair of the toroidal magnetic layers in the pair of the magneto-resistive devices shares the physical space identical to a part of the other toroidal magnetic layer.

18. A magnetic memory device according to claim 17, wherein
the laminate and the toroidal magnetic layer are electrically connected to each other.

19. A magnetic memory device according to claim 17, wherein
the first write line and the second write line extend in parallel to each other in a region where the first write line and the second write line penetrate through the toroidal magnetic layer.

20. A magnetic memory device according to claim 17, wherein
the magnetization directions of the magnetic sensitive layers in the pair of magneto-resistive devices are changed by a magnetic field generated by currents flowing through the first write line and the second write line penetrating through the toroidal magnetic layer so as to be turned in antiparallel to each other, thereby information is stored in the magnetic storage cell.

21. A magnetic memory device according to claim 20, wherein
either of a first state in which either of the pair of magnetic sensitive layers in the pair of magneto-resistive devices is magnetized in a first direction, and the other one is magnetized in a second direction antiparallel to the first direction, or a second state in which either of the pair of magnetic sensitive layers is magnetized in the second direction and the other one is magnetized in the first direction is selected,
thereby information is stored in the magnetic storage cell corresponding to the first state and the second state.

22. A magnetic memory device according to claim 17, further comprising:
a pair of first read lines which are connected to the pair of magneto-resistive devices, and supply read currents to the magneto-resistive devices,
wherein information is read out from the magnetic storage cell on the basis of a current flowing through each of the laminates.

23. A magnetic memory device according to claim 22, wherein
read currents are supplied from the pair of first read lines to the pair of magneto-resistive devices, and information is read out from the magnetic storage cell on the basis of a difference between a pair of read current values.

24. A magnetic memory device according to claim 17, wherein
a pair of the magnetic sensitive layers constitute parts of the toroidal magnetic layer.

25. A magnetic memory device according to claim 17, wherein
the pair of magnetic sensitive layer each include a first magnetic sensitive portion and a second magnetic sensitive portion which are magnetically exchange coupled to each other, and
the first magnetic sensitive portion constitutes a part of the toroidal magnetic layer.

26. A magnetic memory device according to claim 25, wherein
a pair of first non-magnetic conductive layers for antiferromagnetically coupling between the pair of first magnetic sensitive portions and the pair of second magnetic sensitive portions are disposed between the pair of first magnetic sensitive portions and the pair of second magnetic sensitive portions.

27. A magnetic memory device according to claim 25, wherein
the pair of second magnetic sensitive portions have a larger coercivity than the pair of first magnetic sensitive portions.

28. A magnetic memory device according to claim 17, wherein
a pair of the laminates each include:
a non-magnetic layer;
a first magnetic layer stacked on one side of the non-magnetic layer and having a fixed magnetization direction; and
the magnetic sensitive layer stacked on a side of the non-magnetic layer opposite to the side where the first magnetic layer is disposed,
wherein information is detected on the basis of currents flowing through the pair of laminates.

29. A magnetic memory device according to claim 17, wherein
a pair of the laminates each include:
a non-magnetic layer;
a first magnetic layer stacked on one side of the non-magnetic layer and having a fixed magnetization direction; and
a second magnetic layer stacked on a side of the non-magnetic layer opposite to the side where the first magnetic layer is disposed and functioning as the second magnetic sensitive portion,
wherein information is detected on the basis of currents flowing through the pair of laminates.

30. A magnetic memory device according to claim 29, wherein
the first magnetic layer has a larger coercivity than the second magnetic layer.

31. A magnetic memory device according to claim 29, wherein
an antiferromagnetic third magnetic layer which is exchange coupled to the first magnetic layer is disposed on a side of the first magnetic layer opposite to a side where the non-magnetic layer is disposed.

32. A magnetic memory device according to claim 29, wherein
a fourth magnetic layer which is exchange coupled to the first magnetic layer is disposed between the first magnetic layer and the non-magnetic layer.

33. A magnetic memory device according to claim 32, wherein
a second non-magnetic conductive layer for antiferromagnetically coupling between the first magnetic layer and the fourth magnetic layer is disposed between the first magnetic layer and the fourth magnetic layer.

34. A magnetic memory device according to claim 28, wherein
the non-magnetic layer is made of an insulating layer which can generate a tunneling effect.

35. A magnetic memory device according to claim 23 further comprising:
a pair of rectifying devices disposed between the pair of first read lines and the pair of magneto-resistive devices on current paths of read currents supplied to the pair of magneto-resistive devices; and
a second read line leading the read currents flowing through the pair of magneto-resistive devices to the ground.

36. A magnetic memory device according to claim 35, wherein
each of the pair of rectifying devices is a Schottky diode, a PN junction diode, a bipolar transistor or a MOS (Metal-Oxide-Semiconductor) transistor.

37. A magnetic memory device according to claim 17, wherein
a plurality of the laminates and the toroidal magnetic layer are disposed in order on a substrate on which a plurality of rectifying devices are disposed.

38. A magnetic memory device according to claim 37, wherein each of the plurality of the rectifying devices is a bipolar transistor, and the emitter of the bipolar transistor and the magneto-resistive device are electrically connected to each other.

39. A magnetic memory device according to claim 37, wherein each of the plurality of the rectifying devices is a MOS (Metal-Oxide-Semiconductor) transistor, and the source of the MOS transistor and the magneto-resistive device are electrically connected to each other.

40. A magnetic memory device according to claim 37, wherein each of the plurality of rectifying devices is a Schottky diode, and includes a conductive layer and an epitaxial layer in order from a side closer to the magneto-resistive device, and a Schottky barrier is formed between the conductive layer and the epitaxial layer.

* * * * *